United States Patent
Kumar et al.

(10) Patent No.: US 11,145,359 B2
(45) Date of Patent: Oct. 12, 2021

(54) REDUCED RETENTION LEAKAGE SRAM

(71) Applicant: STMicroelectronics International N.V., Geneva (CH)

(72) Inventors: Ashish Kumar, Ranchi (IN); Mohammad Aftab Alam, Masaurhi (IN)

(73) Assignee: STMicroelectronics International N.V., Geneva (CH)

(*) Notice: Subject to any disclaimer, the term of this patent is extended or adjusted under 35 U.S.C. 154(b) by 0 days.

(21) Appl. No.: 16/809,006

(22) Filed: Mar. 4, 2020

(65) Prior Publication Data

US 2020/0327927 A1  Oct. 15, 2020

Related U.S. Application Data

(60) Provisional application No. 62/831,916, filed on Apr. 10, 2019.

(51) Int. Cl.
*G11C 11/4099* (2006.01)
*G11C 5/14* (2006.01)
*G11C 11/413* (2006.01)
*G11C 11/4074* (2006.01)

(52) U.S. Cl.
CPC .......... *G11C 11/4099* (2013.01); *G11C 5/148* (2013.01); *G11C 11/4074* (2013.01); *G11C 11/413* (2013.01)

(58) Field of Classification Search
CPC ... G11C 11/4099; G11C 5/148; G11C 11/413; G11C 11/4074; G11C 5/14; G11C 7/14; G11C 7/02; G11C 11/417

See application file for complete search history.

(56) References Cited

U.S. PATENT DOCUMENTS

| | | | |
|---|---|---|---|
| 6,768,355 B1 * | 7/2004 | Henry | G11C 5/005 327/143 |
| 7,039,818 B2 | 5/2006 | Deng et al. | |
| 7,092,307 B2 | 8/2006 | Chen et al. | |
| 7,348,804 B2 | 3/2008 | Hoberman et al. | |
| 7,489,584 B2 | 2/2009 | Dang et al. | |
| 7,684,262 B2 | 3/2010 | Zampaglione et al. | |
| 7,986,566 B2 | 7/2011 | Houston | |
| 9,013,943 B2 | 4/2015 | Masleid | |
| 9,123,436 B2 | 9/2015 | Chiou et al. | |
| 10,122,347 B2 * | 11/2018 | Cho | G11C 11/413 |

(Continued)

*Primary Examiner* — Khamdan N. Alrobaie
(74) *Attorney, Agent, or Firm* — Crowe & Dunlevy

(57) ABSTRACT

A memory device includes a memory array powered between a virtual supply and virtual ground nodes. A dummy memory array is powered between first and second nodes. A virtual supply generation circuit generates a virtual supply voltage at the virtual supply node as a function of a first control voltage. A virtual ground generation circuit generates a virtual ground at the virtual ground node as a function of a second control voltage. A first control voltage generation circuit coupled between the first node and a power supply voltage generates the first control voltage as tracking retention noise margin (RNM) of the memory array, the first control voltage falling as the RNM decreases. A second control voltage generation circuit coupled between the second node and ground generates the second control voltage as tracking RNM of the memory array, the second control voltage rising as the RNM decreases.

28 Claims, 16 Drawing Sheets

(56) References Cited

U.S. PATENT DOCUMENTS

| | | | |
|---|---|---|---|
| 2006/0050590 A1* | 3/2006 | Nautiyal | G11C 11/413 |
| | | | 365/226 |
| 2009/0135661 A1* | 5/2009 | Hold | G11C 5/14 |
| | | | 365/189.09 |
| 2010/0149884 A1* | 6/2010 | Kumar | G11C 5/147 |
| | | | 365/189.09 |
| 2010/0322016 A1* | 12/2010 | Kumar | G11C 7/02 |
| | | | 365/189.07 |
| 2020/0327927 A1* | 10/2020 | Kumar | G11C 11/4074 |

* cited by examiner

| Corner | Ctrl2 | Vgnd | Vgnd (prior art) |
|---|---|---|---|
| FF/125 | 0.198V | 0.279V | 0.221V |
| FS/125 | 0.121V | 0.287V | 0.234V |
| SF/125 | 0.411V | 0.196V | 0.229V |
| SS/125 | 0.179V | 0.280V | 0.234V |
| TT/125 | 0.189V | 0.278V | 0.229V |
| FF/25 | 0.139V | 0.265V | 0.185V |
| FS/25 | 0.080V | 0.217V | 0.177V |
| SF/25 | 0.301V | 0.157V | 0.187V |
| SS/25 | 0.131V | 0.252V | 0.199V |
| TT/25 | 0.135V | 0.259V | 0.193V |
| FF/-40 | 0.254V | 0.152V | 0.225V |
| FS/-40 | 0.183V | 0.187V | 0.232V |
| SF/-40 | 0.363V | 0.186V | 0.212V |
| SS/-40 | 0.276V | 0.164V | 0.253V |
| TT/-40 | 0.267V | 0.158V | 0.241V |

FIG. 7C

REDUCED RETENTION LEAKAGE SRAM

RELATED APPLICATION

This application claims priority to United States Provisional Application for Patent No. 62/831,916, filed Apr. 10, 2019, the contents of which are incorporated by reference in their entirety to the maximum extent allowable under the law.

TECHNICAL FIELD

This disclosure is related to the field of virtual supply and/or virtual ground voltage generation for use in powering memory arrays.

BACKGROUND

Static random access memory (SRAM) arrays are routinely used in electronics due to their ability for quick data access. So as to reduce die area of SRAM arrays, the size of transistors used in SRAM memory arrays is ever shrinking.

An example SRAM cell 19 is shown in FIG. 1. It can be seen that the SRAM cell 19 is comprised of a pair of cross coupled CMOS inverters 21 and 22 powered between a virtual supply voltage (virtual VDD) node and a virtual ground voltage (virtual GND) node. The CMOS inverters 21 and 22 are selectively connected to a bit line BL and a complementary bit line BLB by NMOS transistors MN3 and MN4 in response to an assertion of a word line signal WL. The CMOS inverter 21 is comprised of PMOS transistor MP1 having its source coupled to virtual VDD, and its drain and gate respectively coupled to the drain and gate of NMOS transistor MN1. The NMOS transistor MN1 has its source coupled to virtual GND. The CMOS inverter 22 is comprised of PMOS transistor MP2 having its source coupled to virtual VDD, and its drain and gate respectively coupled to the drain and gate of NMOS transistor MN2. The NMOS transistor MN2 has its source coupled to virtual VDD. Note that the gates of transistors MP1 and MN1 are coupled to the drains of transistors MP2 and MN2, while the gates of transistors MP2 and MN2 are coupled to the drains of transistors MP1 and MN1.

Retention noise margin (RNM) is a measure of stability of a SRAM cell, such as the SRAM cell 19, during standby (in the absence of a read or a write operation). RNM is a function of the supply and ground voltages between which the SRAM cell 19 is powered. If RNM decreases sufficiently, the inverters 21 and 22 could change state in the absence of a write operation, meaning that the data bit stored therein would be lost. This is clearly undesirable. While some techniques for increasing RNM are known, such techniques may be insufficient for certain use cases. Therefore, further development into circuits for increasing RNM is required.

SUMMARY

Disclosed herein is a memory device including a memory array powered between a supply voltage node and a virtual ground voltage node, and a dummy memory array powered between first and second nodes. The dummy memory array includes at least some transistors that are replicas of transistors of the memory array. A virtual ground generation circuit is configured to generate a virtual ground voltage at the virtual ground voltage node as a function of a control voltage. A control voltage generation circuit is coupled between the second node and ground and is configured to generate the control voltage as tracking retention noise margin (RNM) of the memory array, the control voltage rising as the RNM decreases.

The control voltage generation circuit may include a plurality of diode coupled n-channel transistors coupled between the second node and ground, with the control voltage being generated at a drain of one of the plurality of diode coupled n-channel transistors.

The virtual ground generation circuit may include a first branch including at least one diode coupled n-channel transistor coupled between the virtual ground voltage node and ground, the virtual ground voltage being generated at a drain of the at least one diode coupled n-channel transistor. A second branch may include an n-channel transistor that enables or disables the second branch in response to the control voltage, the second branch being coupled in parallel with the first branch.

The second branch may include at least one diode coupled n-channel transistor connected to the n-channel transistor that enables or disables the second branch.

The virtual ground generation circuit may also include an enable n-channel transistor that selectively couples the virtual ground voltage node to ground in response to an enable signal.

A virtual supply generation circuit may be configured to generate a virtual supply voltage at the supply voltage node as a function of an additional control voltage. An additional control voltage generation circuit may be coupled between the first node and a power supply voltage and configured to generate the additional control voltage as tracking RNM of the memory array, the additional control voltage falling as RNM decreases.

Also disclosed herein is a memory device including a memory array powered between a virtual supply voltage node and a virtual ground voltage node, and a dummy memory array powered between first and second nodes. The dummy memory array includes at least some transistors that are replicas of transistors of the memory array. A virtual supply voltage generation circuit is configured to generate a virtual supply voltage at the virtual supply voltage node as a function of a control voltage. A control voltage generation circuit is coupled between the first node and a power supply voltage and configured to generate the control voltage as tracking retention noise margin (RNM) of the memory array, the control voltage falling as the RNM decreases.

The control voltage generation circuit may include a plurality of diode coupled p-channel transistors coupled between the virtual supply voltage node and the power supply voltage, the control voltage being generated at a drain of one of the plurality of diode coupled p-channel transistors.

The virtual supply voltage generation circuit may include a first branch with at least one diode coupled p-channel transistor coupled between the virtual supply voltage node and the power supply voltage, the virtual supply voltage being generated at a drain of the at least one diode coupled p-channel transistor, and a second branch with a p-channel transistor that enables or disables the second branch in response to the control voltage, the second branch being coupled in parallel with the first branch.

The second branch may also include at least one diode coupled p-channel transistor connected to the p-channel transistor that enables or disables the second branch.

The virtual supply voltage generation circuit may also include an enable p-channel transistor that selectively couples the virtual supply voltage node to the power supply voltage in response to an enable signal.

Method aspects are disclosed herein as well. For example, a method includes powering a memory array between a virtual supply voltage and a virtual ground voltage, monitoring retention noise margin (RNM) of the memory array, asserting a control signal in response to the RNM falling below a threshold RNM value, and lowering the virtual ground voltage and/or raising the virtual supply voltage in response to assertion of the control signal.

Another method includes powering a memory array between a supply voltage and a virtual ground voltage, monitoring retention noise margin (RNM) of the memory array, asserting a control signal in response to the RNM falling below a threshold RNM value, and lowering the virtual ground voltage in response to assertion of the control signal.

BRIEF DESCRIPTION OF THE DRAWINGS

FIG. 7C is a chart showing control voltages and virtual ground voltages for the devices of this disclosure at different temperatures and for different process corners.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein.

Figure 1:
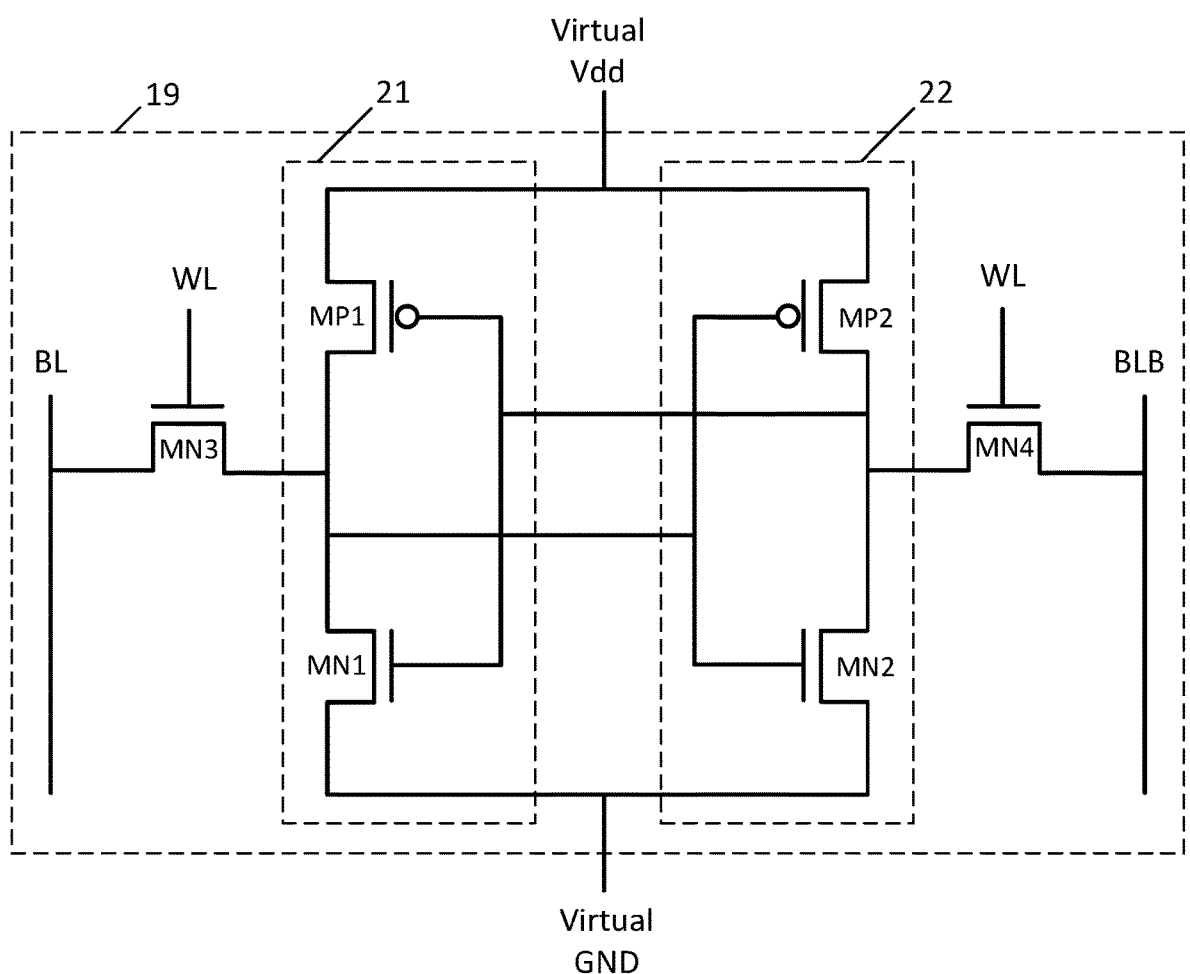
FIG. 1 shows is a schematic block diagram of SRAM memory cell.
Figure 2A:
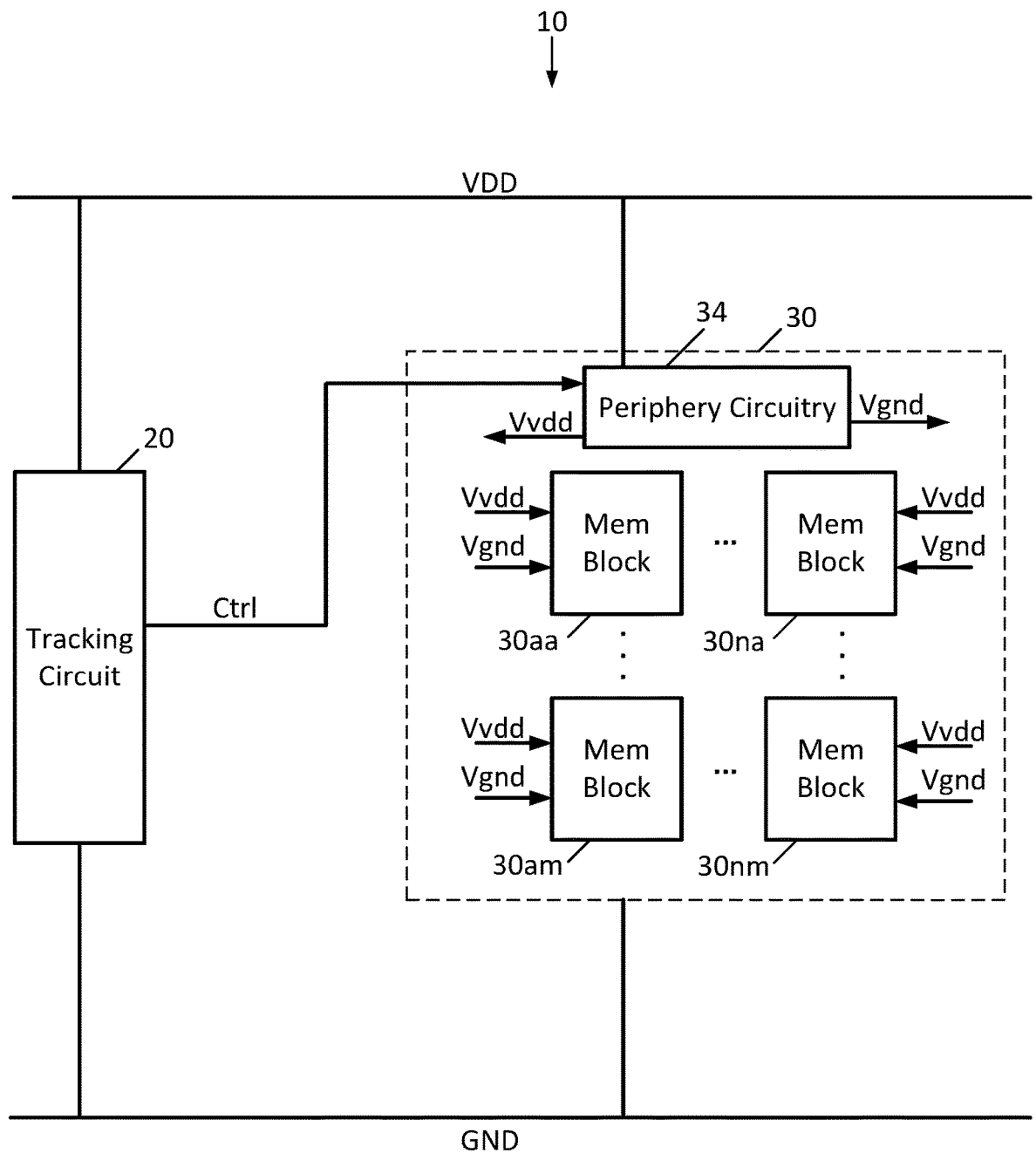
FIG. 2A is a block diagram of a memory device incorporating a tracking circuit that generates control signals for virtual VDD and virtual GND generation circuits that power a memory array.

A block diagram of a memory device 10 is now described with initial reference to FIG. 2. The memory device 10 includes a memory array 30 connected between a supply voltage VDD and a ground voltage GND, and a tracking circuit 20 also connected between VDD and GND. The memory array 30 is comprised of an array of memory blocks arranged into rows and columns shown using alphabetical indices to indicate position within the array, such that the memory blocks in the first row are labeled as 30aa . . . 30na and the memory blocks in the last row are labeled as 30am . . . 30nm, and such that the memory blocks in the first column are labeled as 30aa . . . 30am and the memory blocks in the last column are labeled as 30na . . . 30nm. Each memory block of the memory array 30 may be an individual memory cell sharing common periphery circuitry 34 as shown in FIG. 2A It should be understood that the periphery circuitry 34 serves to generate virtual supply and virtual ground voltages Vvdd and Vgnd for powering its respective memory cells. So as to reduce leakage currents through the memory array 30 and the resulting power consumption, it is desired for the virtual supply voltage Vvdd to be lower than VDD and for the virtual ground voltage Vgnd to be higher than GND. However, as the difference between this generated virtual supply voltage Vvdd and virtual ground voltage Vgnd decreases, the retention noise margin (RNM) for the memory array 30 decreases. When the difference between the generated virtual supply voltage Vvdd and the virtual ground voltage Vgnd decreases below a threshold difference value, there is a corresponding deterioration in the RNM, such that the RNM may be sufficiently low that that data loss may occur during standby mode with one or more memory cells of the memory array 30 (e.g., such as those "worst case" cells in terms of PVT variation). Therefore, it is desired for the virtual supply voltage Vvdd to be lower than VDD, but not so much lower that RNM deteriorates sufficiently to cause data loss; likewise it is desired for the virtual ground voltage Vgnd to be higher than GND but not so much higher that RNM deteriorates sufficiently to cause data loss. Since RNM is affected by operating conditions, setting Vvdd and Vgnd to levels such that RNM deterioration would not occur under any expected operating conditions means setting Vvdd and Vgnd to the levels needed for worst case operation conditions, meaning that excess leakage currents would be present during non-worst case operating conditions. This is undesirable.

To avoid this scenario and allow Vvdd and Vgnd to be set appropriately for existing operating conditions, the tracking circuit 20 serves to track the difference between VDD and GND (or between the virtual supply voltage Vvdd and virtual ground voltage Vgnd, in which case the inputs to tracking circuit 20 will be taken from node Vvdd (instead of Vdd) and Vgnd (instead of GND), either directly or indirectly, and generates the control signal Ctrl in response to the difference. The control signal Ctrl is received by the periphery circuitry 34, and depending upon the difference between VDD and GND (or between Vvdd and Vgnd) the tracking circuit 20 may instruct the periphery circuitry 34 to raise the virtual supply voltage Vvdd and/or lower the virtual ground voltage Vgnd so as to increase the difference therebetween and reestablish a safe RNM.

Figure 2B:
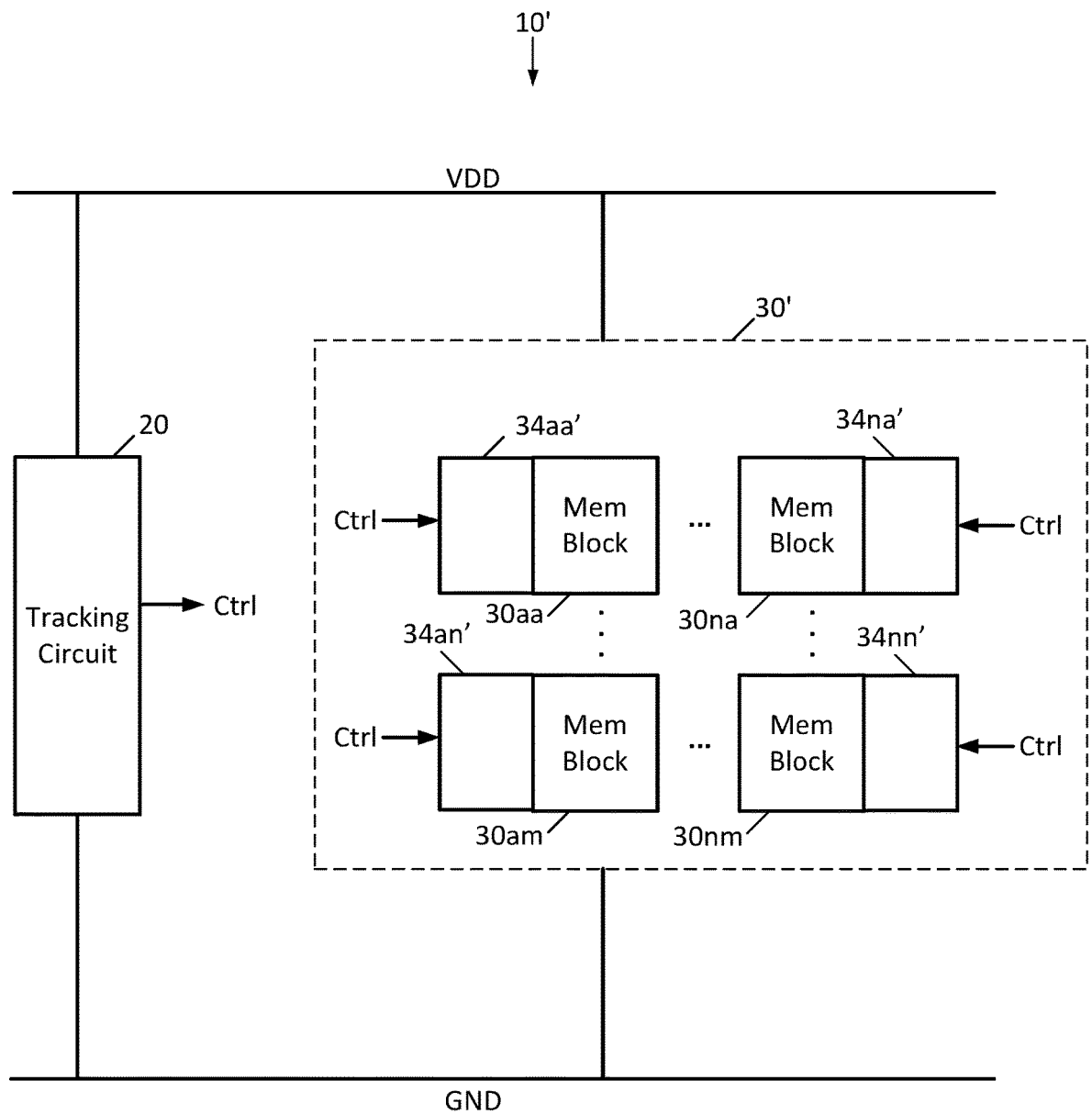
FIG. 2B is a block diagram of another memory device incorporating a tracking circuit that generates control signals for virtual VDD and virtual GND generation circuits that power a memory array.

In some cases, each memory block 30' may itself be a sub-array of memory cells, with the memory cells of each sub-array sharing common periphery circuitry specific to that sub-array as shown in FIG. 2B. The periphery circuits 34' in FIG. 2B operate as described above, and each receive the control signal Ctrl from which Vvdd and/or Vgnd are generated.

Figure 3A:
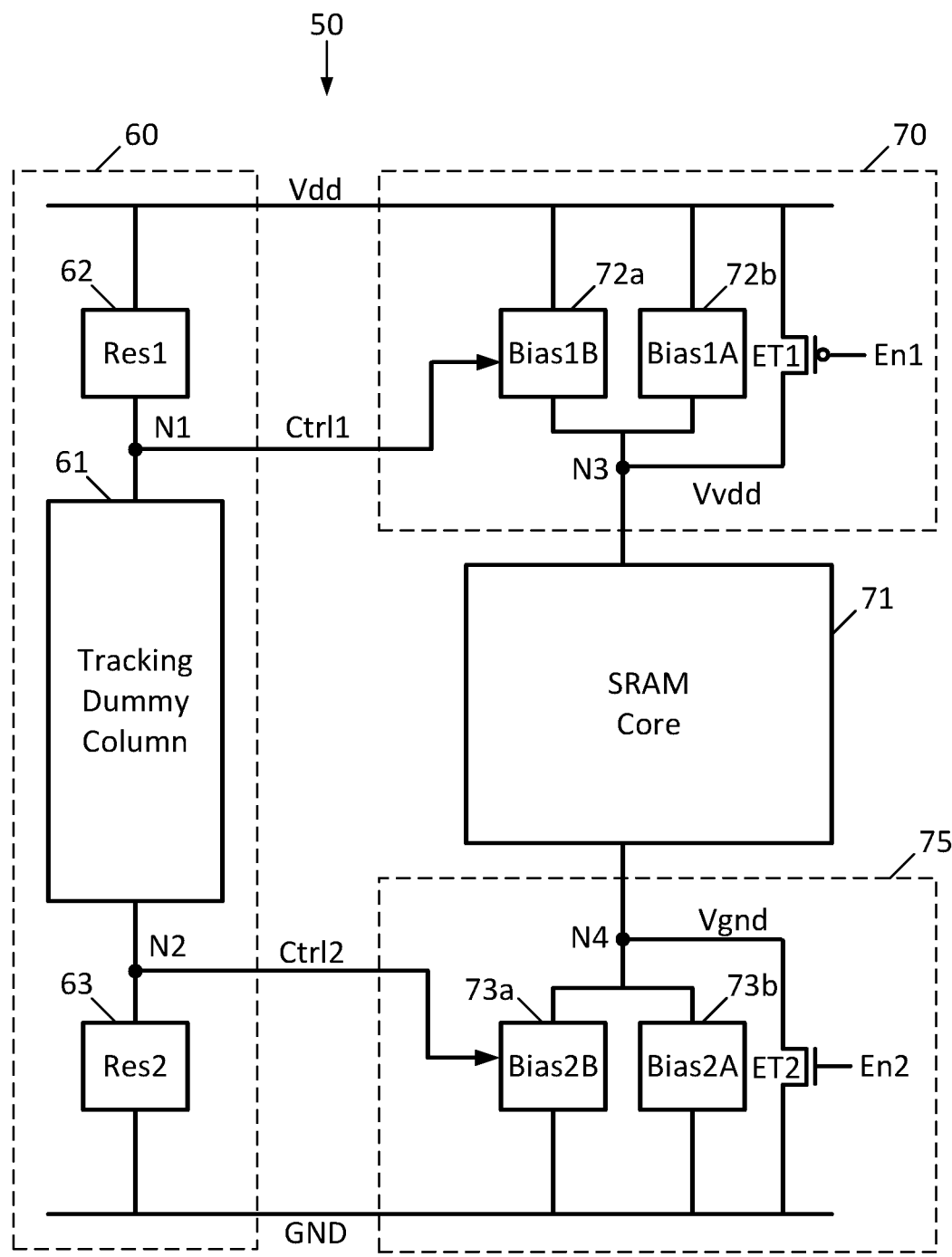
FIG. 3A is a schematic block diagram of a memory device incorporating a tracking circuit that generates control signals for virtual VDD and virtual GND generation circuits that power a memory array.

Now described with reference to FIG. 3A is a schematic block diagram of a memory device 50 incorporating a tracking circuit 60 that generates control signals for virtual supply voltage Vvdd and virtual ground Vgnd generation circuits 70 and 75 that power a memory array (e.g., a SRAM core) 71.

The virtual supply generation circuit 70 is comprised of a first branch 72a and a second branch 72b coupled between node N3 and VDD, with an enable transistor ET1 that selectively connects node N3 directly to VDD (therefore tying Vvdd to VDD) as a function of enable signal En1. The virtual ground generation circuit 75 is comprised of a first branch 73a and a second branch 73b coupled between node N4 and GND, with an enable transistor ET2 that selectively connects node N4 directly to ground GND (therefore tying Vgnd to GND) as a function of enable signal En2.

The tracking circuit 60 is comprised of a dummy column 61 coupled between nodes N1 and N2, the dummy column 61 containing replica transistors and replica memory cells of some of those in the memory array 71 such that the same PVT variation affecting the memory array 71 similarly affects the dummy column 61. The tracking circuit 60 also includes constriction circuit 62 coupled between node N1 and VDD, and constriction circuit 63 coupled between node N2 and GND.

In operation of the memory device 50, the difference between GND and VDD (or between virtual supply Vvdd and virtual ground Vgnd) may fall at different process corners, and as explained, if this difference were to fall sufficiently, the worst case transistors within the memory array 71 for that corner could switch, causing the memory cell into which they are incorporated to lose data. Therefore, the constriction circuits 62 and 63 are designed such so that the control signal Ctrl1 falls as Vvdd falls, and falls at a rate sufficient to enable the first branch 72a of the virtual supply generation circuit 70 before the difference between Vvdd and Vgnd decreases enough to result in potential data loss due to low RNM, and so that the control signal Ctrl2 rises as Vgnd rises, and rises at a rate sufficient to enable the first branch 73a of the virtual ground generation circuit 75 before the difference between Vvdd and Vgnd decreases enough to result in potential data loss. The enabling of the first branch 72a connects the first branch 72a in parallel with the second branch 72b, with the result being that the voltage drop between VDD and Vvdd falls and therefore Vvdd rises; likewise, the enabling of the first branch 73a connects the first branch 73a in parallel with the second branch 73b, with the result being that the voltage drop between GND and Vgnd falls and therefore Vgnd falls; collectively this increases the difference between Vvdd and Vgnd to thereby raise RNM to a safe level, and since as explained the first branches 72a and 73a are turned on prior to RNM lowering enough to result in potential data loss, data loss is prevented.

Figure 3B:
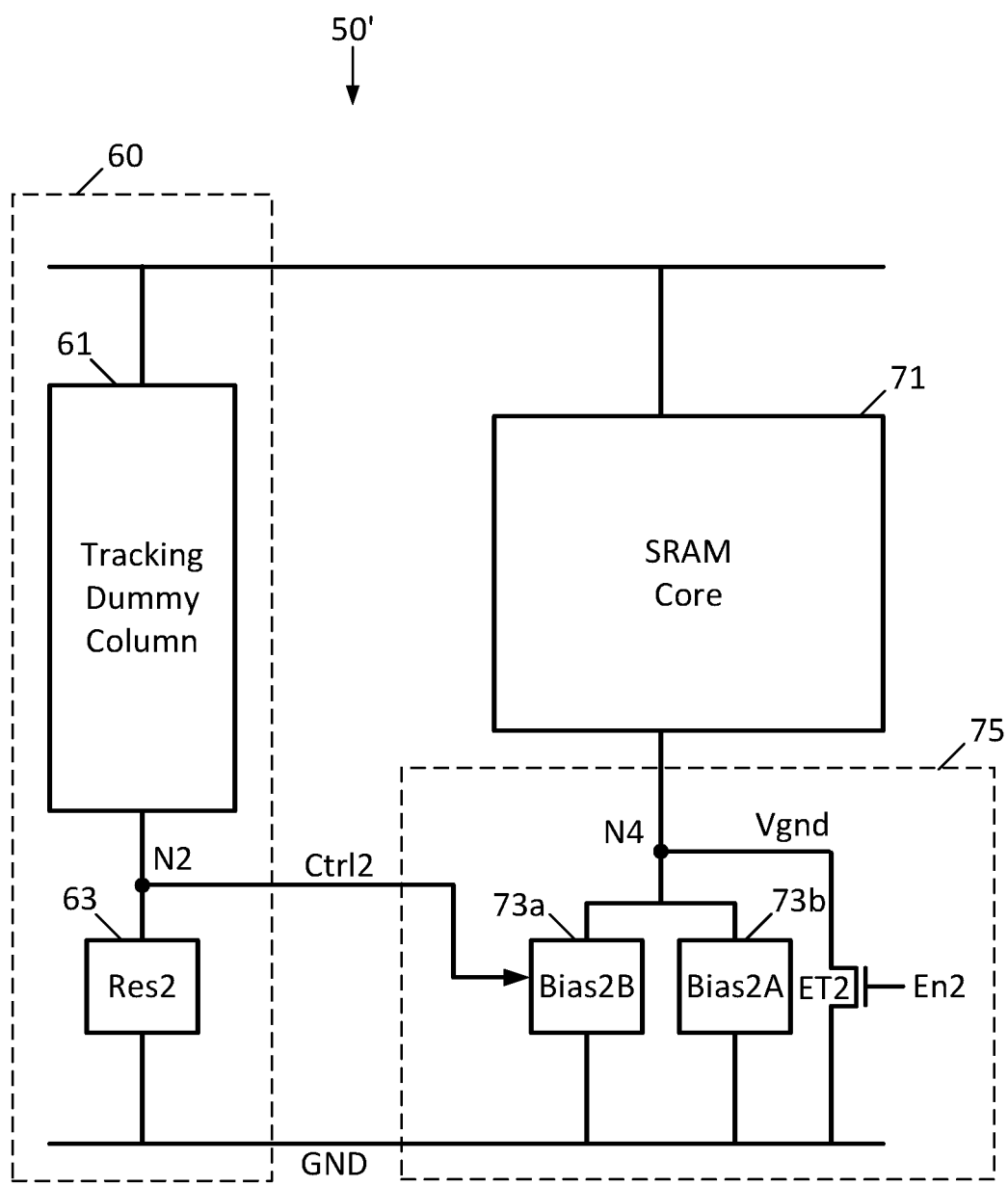
FIG. 3B is a schematic block diagram of a memory device incorporating a tracking circuit that generates a control signals for a virtual GND generation circuit for a memory array.
Figure 3C:
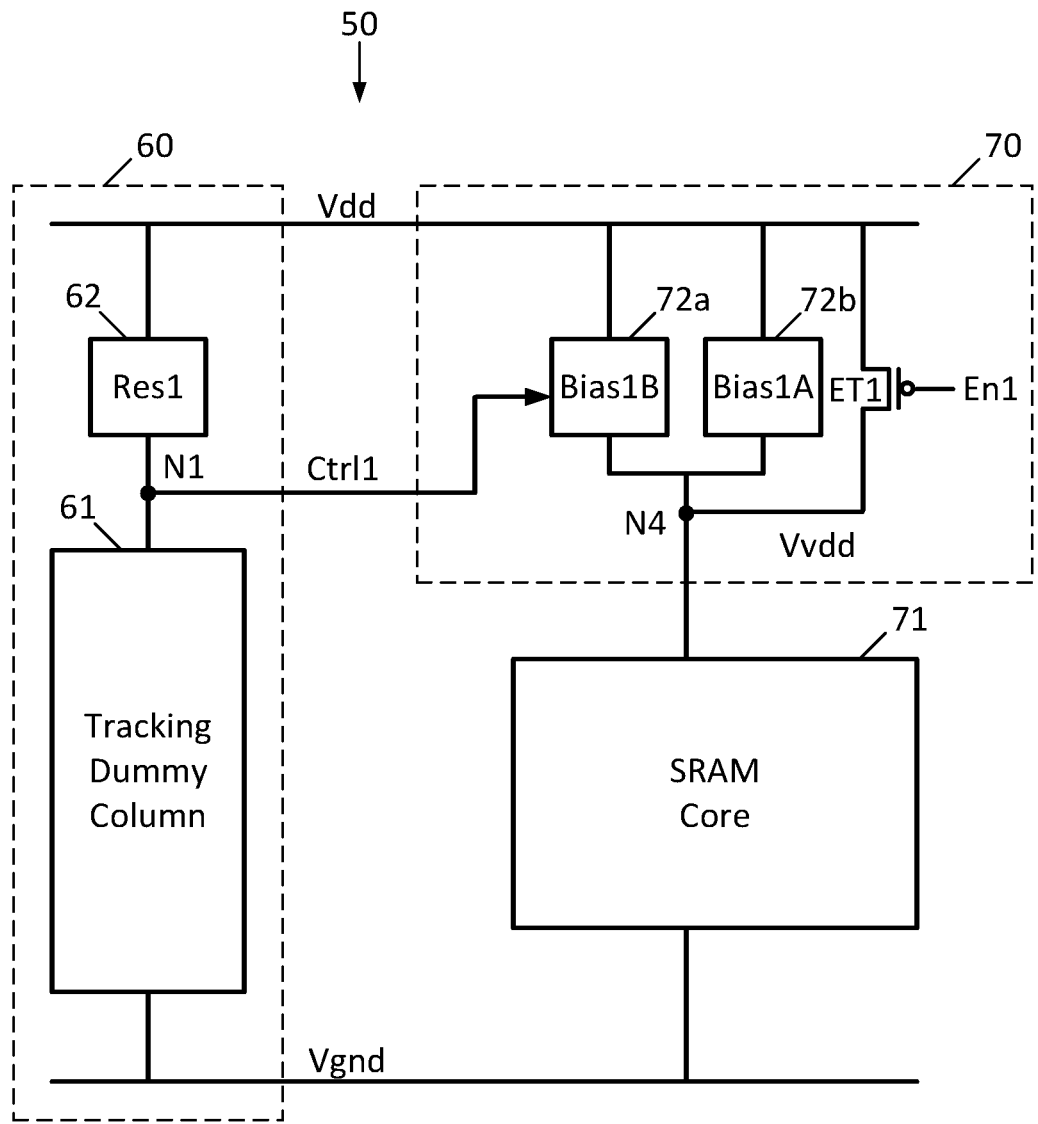
FIG. 3C is a schematic block diagram of a memory device incorporating a tracking circuit that generates a control signals for a virtual VDD generation circuit for a memory array.

It should be appreciated that since the goal is to increase the difference between Vvdd and Vgnd at process corners, both the virtual supply voltage generation circuit 70 and virtual ground voltage generation circuit 75 are not needed in some applications, and that a design in which only one of the virtual supply voltage generation circuit 70 and virtual ground voltage generation circuit 75 is present may be used. Therefore, a design is shown in FIG. 3B in which the virtual supply voltage generation circuit 70 design of FIG. 3A is not present and it can be assumed that the memory array 71 is either tied directly to VDD or receives a virtual supply voltage from a known virtual supply voltage generation circuit. Likewise, a design is shown in FIG. 3C in which the virtual ground generation circuit 75 design of FIG. 3A is not present and it can be assumed that the memory array 71 is either tied directly to GND or receives a virtual ground voltage from a known virtual ground generation circuit.

Figure 4A:
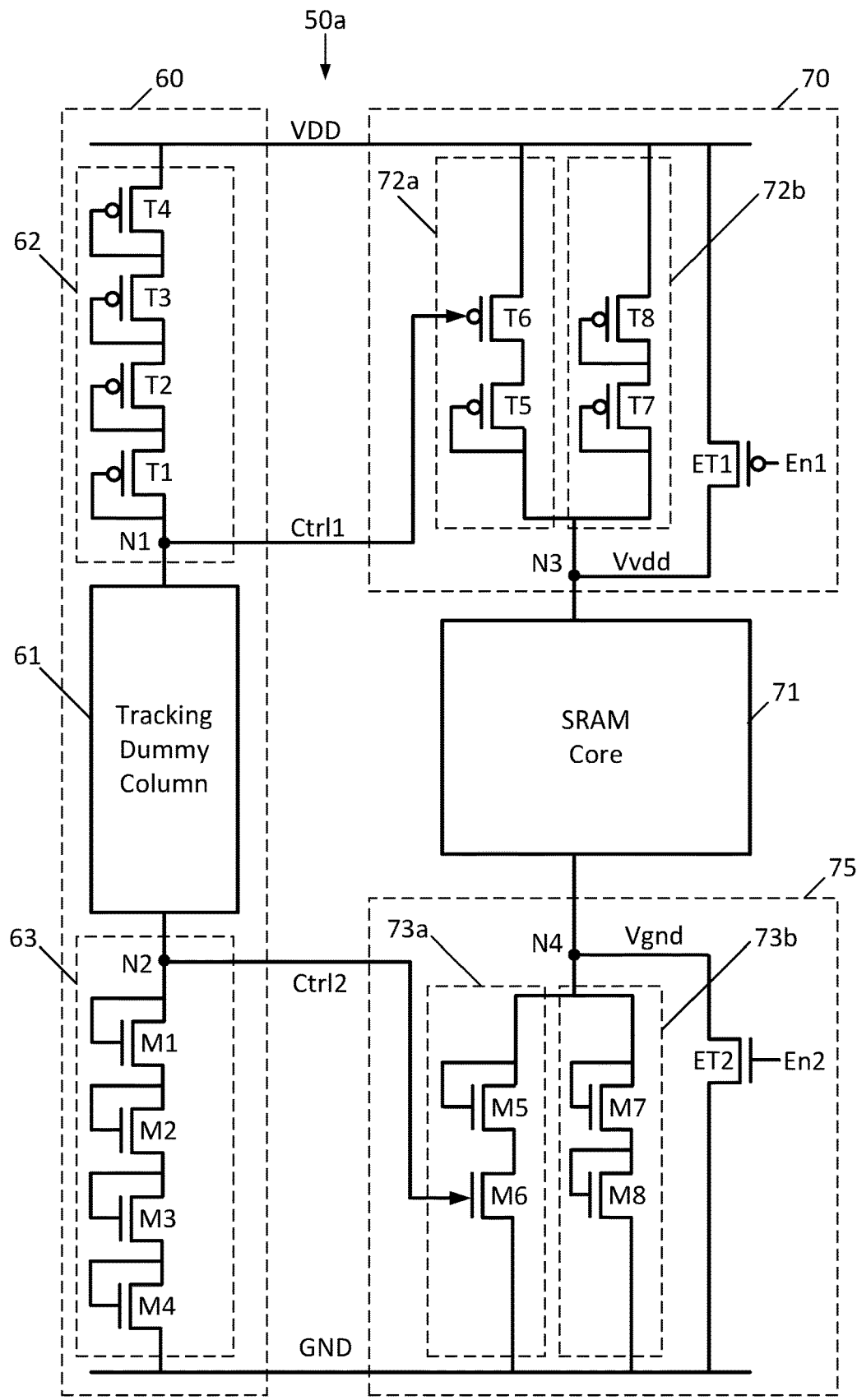
FIG. 4A is a first embodiment of the memory device of FIG. 3A.

Now described with reference to FIG. 4A is a schematic block diagram of a memory device 50a incorporating a tracking circuit 60 that generates control signals for virtual supply voltage Vvdd and virtual ground Vgnd generation circuits 70 and 75 that power a memory array (e.g., a SRAM core) 71.

The tracking circuit 60 is comprised of a dummy column 61 coupled between nodes N1 and N2, the dummy column 61 containing replica transistors and replica memory cells of some of those in the memory array 71 such that the same PVT variation affecting the memory array 71 similarly affects the dummy column 61. The tracking circuit 60 also includes constriction circuit 62 coupled between node N1 and VDD, and constriction circuit 63 coupled between node N2 and GND.

The constriction circuit 62 is comprised of diode coupled p-channel transistors T1-T4 connected in series between node N1 and VDD, while the constriction circuit 63 is comprised of diode coupled n-channel transistors M1-M4 connected in series between node N2 and GND. A control signal Ctrl1 is produced at node N1, and a control signal Ctrl2 is produced at node N2.

Virtual supply voltage Vvdd generation circuit 70 is comprised of a first branch 72a and a second branch 72b that are coupled between VDD and node N3 and collectively serve to generate the virtual supply voltage Vvdd at node N3, and an enable transistor ET1 that selectively bypasses the first and second branches 72a and 72b to directly tie Vvdd to VDD.

In particular, the first branch 72a is comprised of a diode coupled p-channel transistor T5 connected to node N3, and of p-channel transistor T6 connected between p-channel transistor T5 and VDD. P-channel transistor T6 has its drain connected to the source of diode coupled p-channel transistor T5, its source connected to VDD, and its gate connected to node N1 to be biased by the control signal Ctrl1. The second branch 72b is comprised of diode coupled p-channel transistors T7 and T8 connected in series between node N3 and VDD. The enable transistor ET1 is a p-channel transistor having its drain connected to node N3, its source connected to VDD, and its gate controlled by enable signal En1.

Virtual ground voltage Vgnd generation circuit 75 is comprised of a first branch 73a and a second branch 73b that are coupled between GND and node N4 and collectively serve to generate the virtual ground voltage Vgnd at node N4, and an enable transistor ET2 that selectively bypasses the first and second branches 73a and 73b to directly tie Vgnd to GND.

In particular, the first branch 73a is comprised of a diode coupled n-channel transistor M5 connected to node N5, and of n-channel transistor M6 connected between n-channel transistor M5 and GND. N-channel transistor M6 has its drain connected to the source of diode coupled n-channel transistor M5, its source connected to GND, and its gate connected to node N2 to be biased by the control signal Ctrl2. The second branch 72b is comprised of diode coupled n-channel transistors M7 and M8 connected in series between node N4 and GND. The enable transistor ET2 is an n-channel transistor having its drain connected to node N4, its source connected to GND, and its gate controlled by enable signal En2.

In operation of the memory device 50a, the difference between virtual supply Vvdd and virtual ground Vgnd may fall at different process corners, and as explained, if this difference were to fall sufficiently, the worse off of transistors within the memory array 71 for that corner could switch, causing the memory cell into which they are incorporated to lose data. Therefore, the number of diode coupled transistors in the constriction circuits 62 and 63 is set so that the control signal Ctrl1 falls as Vvdd falls, and falls at a rate sufficient to turn on p-channel transistor T6 before the difference between Vvdd and Vgnd decreases enough to result in potential data loss due to low RNM, and so that the control signal Ctrl2 rises as Vgnd rises, and rises at a rate sufficient to turn on n-channel transistor M6 before the difference between Vvdd and Vgnd decreases enough to result in potential data loss. The turning on of p-channel transistor T6 connects the first branch 72a in parallel with the second branch 72b, with the result being that the voltage drop between VDD and Vvdd falls and therefore Vvdd rises; likewise, the turning on of n-channel transistor M6 connects the first branch 73a in parallel with the second branch 73b, with the result being that the voltage drop between GND and Vgnd falls and therefore Vgnd falls; collectively this increases the difference between Vvdd and Vgnd to thereby raise RNM to a safe level, and since as explained p-channel transistor T6 and n-channel transistor M6 are turned on prior to RNM lowering enough to result in potential data loss, data loss is prevented.

It should be appreciated that the branches 72a, 72b and 73a, 73b may each contain any number of diode coupled transistors so as to achieve a desired level of the raising of Vvdd or lowering of Vgnd.

Figure 4B:
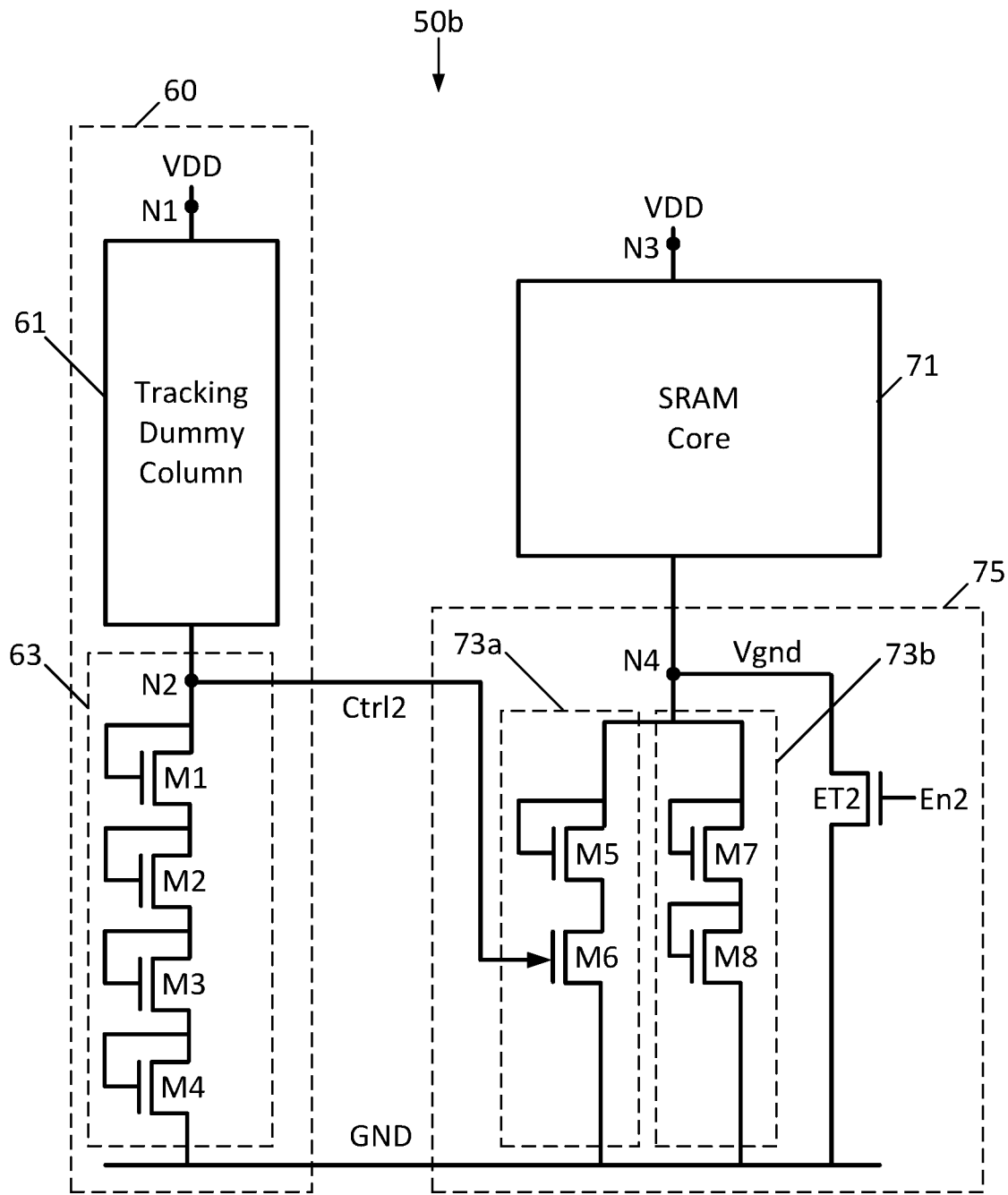
FIG. 4B is variant of the embodiment of FIG. 4A.

It should be understood that the constriction circuit 62 and virtual supply voltage generation circuit 70 need not be present, that node N1 (and thus the tracking dummy column 61) could be directly coupled to VDD, and that node N3 (and thus the SRAM core 71) could be directly coupled to VDD. This is shown in FIG. 4B.

In operation of the memory device 50b, the difference between supply voltage VDD and virtual ground Vgnd may fall at different process corners, and as explained, if this difference were to fall sufficiently, the worse off of transistors within the memory array 71 for that corner could switch, causing the memory cell into which they are incorporated to lose data. Therefore, the number of diode coupled transistors in the constriction circuit 63 is set so that the control signal Ctrl2 rises as Vgnd rises, and rises at a rate sufficient to turn on n-channel transistor M6 before the difference between VDD and Vgnd decreases enough to result in potential data loss. The turning on of n-channel transistor M6 connects the first branch 73a in parallel with the second branch 73b, with the result being that the voltage drop between GND and Vgnd falls and therefore Vgnd falls. This increases the difference between VDD and Vgnd to thereby raise RNM to a safe level, and since as explained n-channel transistor M6 is turned on prior to RNM lowering enough to result in potential data loss, data loss is prevented.

Figure 5A:
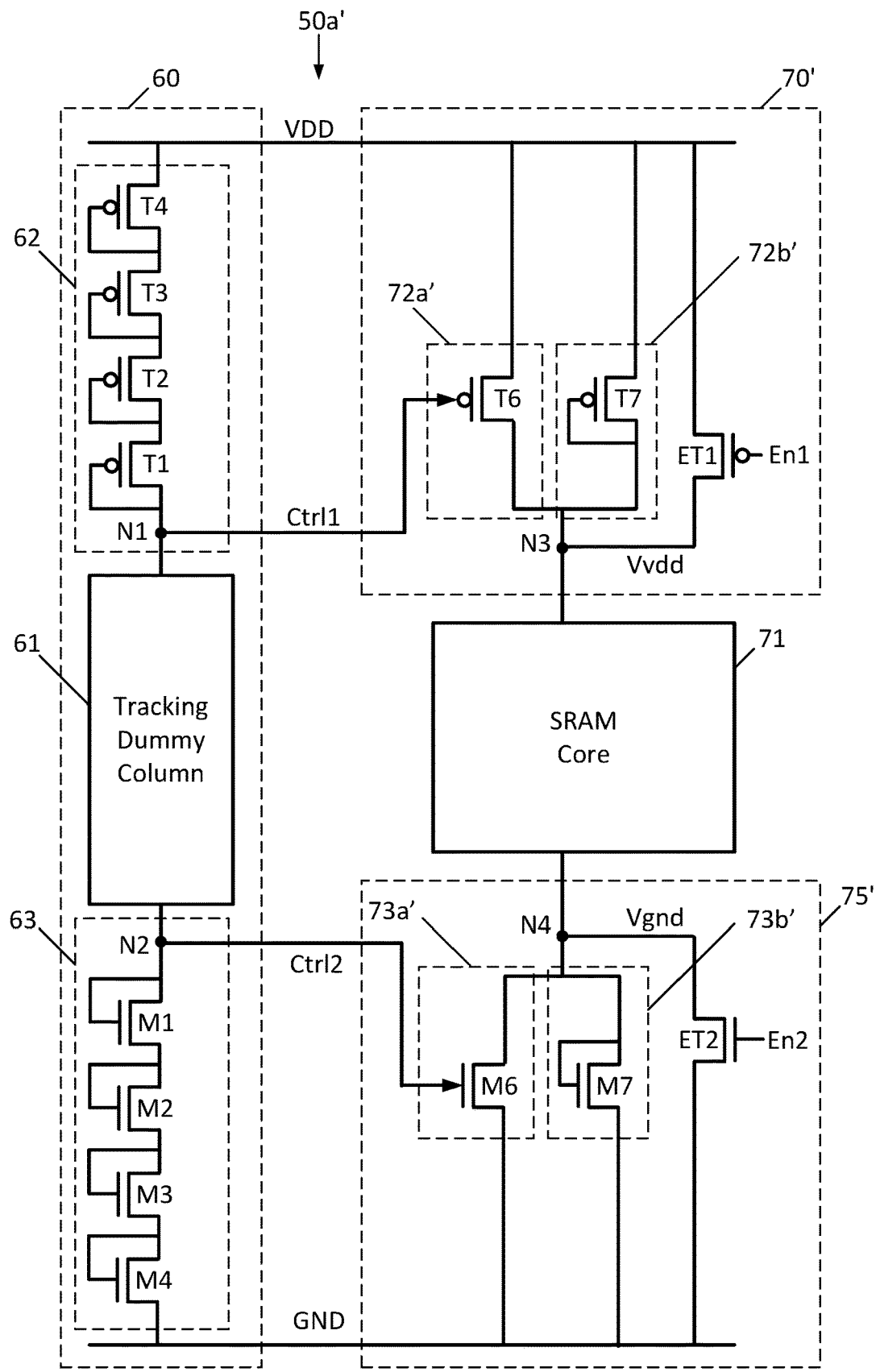
FIG. 5A is a second embodiment of the memory device of FIG. 3A.

An embodiment with fewer diode coupled transistors is shown in FIG. 5A. Now described with reference to FIG. 5A is a schematic block diagram of a memory device 50a' incorporating a tracking circuit 60 that generates control signals for virtual supply voltage Vvdd and virtual ground Vgnd generation circuits 70' and 75' that power a memory array (e.g., a SRAM core) 71.

The tracking circuit 60 is comprised of a dummy column 61 coupled between nodes N1 and N2, the dummy column 61 containing replica transistors and replica memory cells of some of those in the memory array 71 such that the same PVT variation affecting the memory array 71 similarly affects the dummy column 61. The tracking circuit 60 also includes constriction circuit 62 coupled between node N1 and VDD, and constriction circuit 63 coupled between node N2 and GND.

The constriction circuit 62 is comprised of diode coupled p-channel transistors T1-T4 connected in series between node N1 and VDD, while the constriction circuit 63 is comprised of diode coupled n-channel transistors M1-M4 connected in series between node N2 and GND. A control signal Ctrl1 is produced at node N1, and a control signal Ctrl2 is produced at node N2.

Virtual supply voltage Vvdd generation circuit 70' is comprised of a first branch 72a' and a second branch 72b' that are coupled between VDD and node N3 and collectively serve to generate the virtual supply voltage Vvdd at node N3, and an enable transistor ET1 that selectively bypasses the first and second branches 72a' and 72b' to directly tie Vvdd to VDD.

In particular, the first branch 72a' is comprised of a p-channel transistor T6 connected between node N3 and VDD, and having its gate connected to node N1 to be biased by the control signal Ctrl1. The second branch 72b' is comprised of diode coupled p-channel transistor T7 connected between node N3 and VDD. The enable transistor ET1 is a p-channel transistor having its drain connected to node N3, its source connected to VDD, and its gate controlled by enable signal En1.

Virtual ground voltage Vgnd generation circuit 75' is comprised of a first branch 73a' and a second branch 73b' that are coupled between GND and node N4 and collectively serve to generate the virtual ground voltage Vgnd at node N4, and an enable transistor ET2 that selectively bypasses the first and second branches 73a' and 73b' to directly tie Vgnd to GND.

In particular, the first branch 73a' is comprised of n-channel transistor M6 connected between node N4 and GND, and having its gate connected to node N2 to be biased by control signal Ctrl2. The second branch 72b' is comprised of diode coupled n-channel transistor M7 connected between node N4 and GND. The enable transistor ET2 is an n-channel transistor having its drain connected to node N4, its source connected to GND, and its gate controlled by enable signal En2.

In operation of the memory device 50a', the difference between virtual supply Vvdd and virtual ground Vgnd may fall at different process corners, and as explained, if this difference were to fall sufficiently, the worse off of transistors within the memory array 71 for that corner could switch, causing the memory cell into which they are incorporated to lose data. Therefore, the number of diode coupled transistors in the constriction circuits 62 and 63 is set so that the control signal Ctrl1 falls as Vvdd falls, and falls at a rate sufficient to turn on p-channel transistor T6 before the difference between Vvdd and Vgnd decreases enough to result in potential data loss due to low RNM, and so that the control signal Ctrl2 rises as Vgnd rises, and rises at a rate sufficient to turn on n-channel transistor M6 before the difference between Vvdd and Vgnd decreases enough to result in potential data loss. The turning on of p-channel transistor T6 connects the first branch 72a' in parallel with the second branch 72b', with the result being that the voltage drop between VDD and Vvdd falls and therefore Vvdd rises because p-channel transistor T7 is effectively shorted meaning that node N3 is shorted to VDD; likewise, the turning on of n-channel transistor M6 connects the first branch 73a' in parallel with the second branch 73b', with the result being that the voltage drop between GND and Vgnd falls and therefore Vgnd falls because n-channel transistor M7 is effectively shorted meaning that node N4 is shorted to GND; collectively this increases the difference between Vvdd and Vgnd (by tying Vvdd to VDD and tying Vgnd to GND) to thereby raise RNM to a safe level, and since as explained p-channel transistor T6 and n-channel transistor M6 are turned on prior to RNM lowering enough to result in potential data loss, data loss is prevented.

It should be appreciated that the virtual supply voltage generator 70 and virtual ground generator 75 may have additional branches with additional controls to provide for multiple different selectable levels of virtual supply Vvdd raising and virtual ground Vgnd lowering.

Figure 5B:
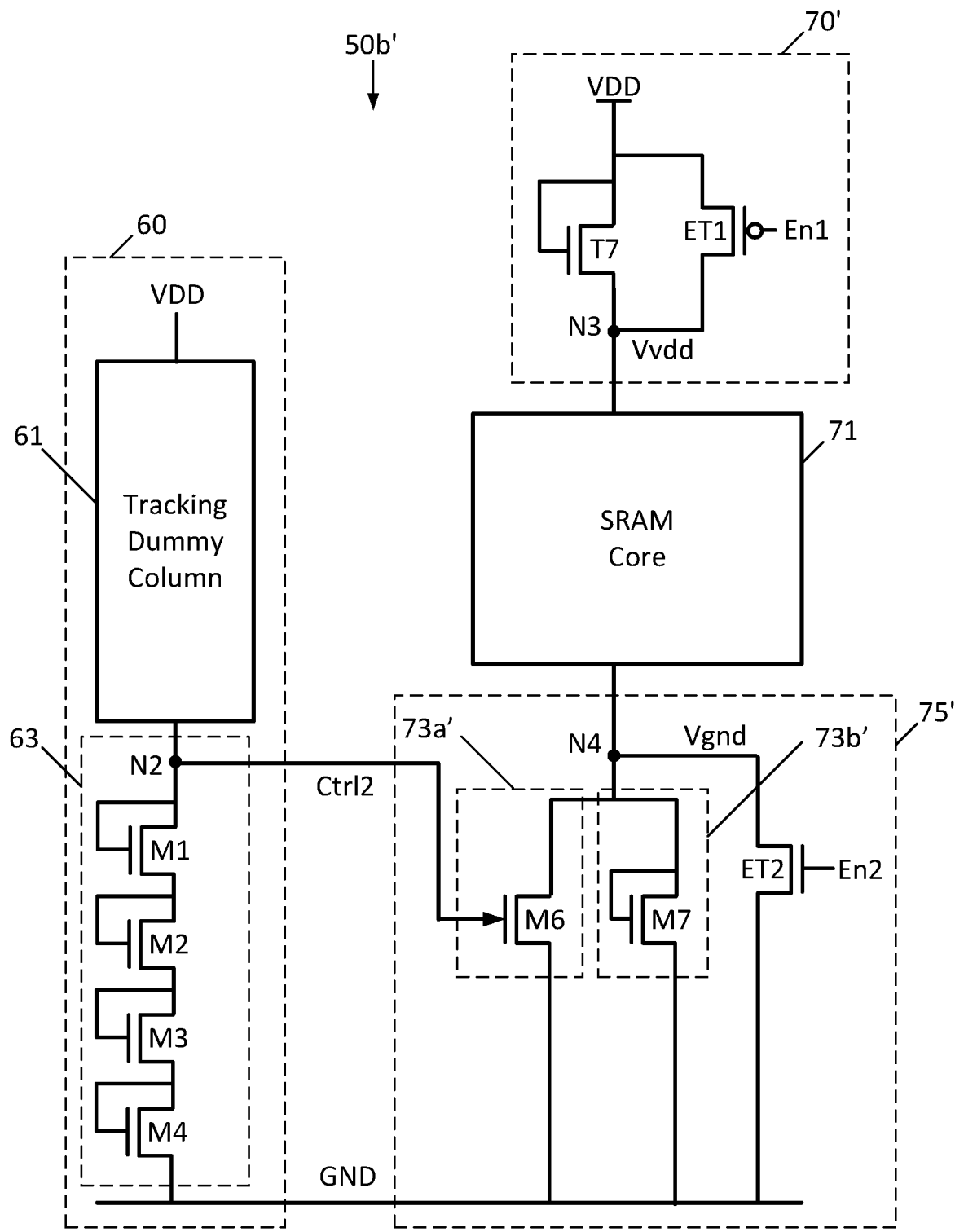
FIG. 5B is variant of the embodiment of FIG. 5A.

It should be understood that the constriction circuit 62 need not be present, that node N1 (and thus the tracking dummy column 61) could be directly coupled to VDD. It should also be understood that the virtual supply voltage generation circuit 70 may comprise a single diode coupled transistor T7 and an enable transistor ET1, and need not contain any transistors controlled as a function of Ctrl1. This is shown in FIG. 5B.

In operation of the memory device 50b', the difference between virtual supply Vvdd and virtual ground Vgnd may fall at different process corners, and as explained, if this difference were to fall sufficiently, the worse off of transistors within the memory array 71 for that corner could switch, causing the memory cell into which they are incorporated to lose data. Therefore, the number of diode coupled transistors in the constriction circuit 63 is set so that the control signal Ctrl2 rises as Vgnd rises, and rises at a rate sufficient to turn on n-channel transistor M6 before the difference between Vvdd and Vgnd decreases enough to result in potential data loss. The turning on of n-channel transistor M6 connects the first branch 73a' in parallel with the second branch 73b', with the result being that the voltage drop between GND and Vgnd falls and therefore Vgnd falls because n-channel transistor M7 is effectively shorted meaning that node N4 is shorted to GND. This increases the difference between Vvdd and Vgnd (by tying Vgnd to GND) to thereby raise RNM to a safe level, and since as explained n-channel transistor M6 is turned on prior to RNM lowering enough to result in potential data loss, data loss is prevented.

Figure 6A:
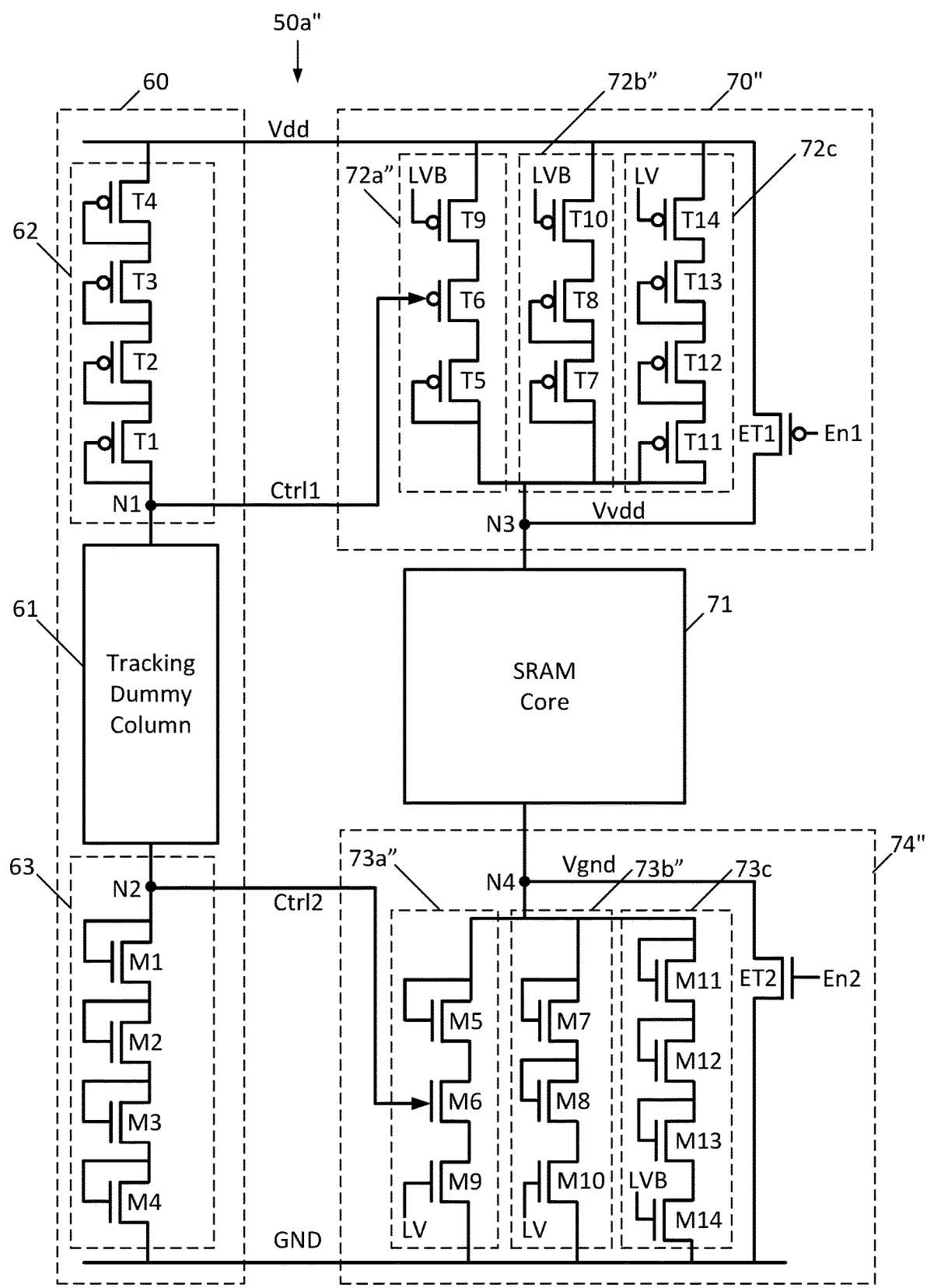
FIG. 6A is a third embodiment of the memory device of FIG. 3A.

An embodiment with additional branches 72c and 73c in the virtual supply voltage generator 70 and virtual ground generator 75 is shown in FIG. 6A. Now described with reference to FIG. 6A is a schematic block diagram of a memory device 50a'' incorporating a tracking circuit 60 that generates control signals for virtual supply voltage Vvdd and virtual ground Vgnd generation circuits 70'' and 75'' that power a memory array (e.g., a SRAM core) 71.

The tracking circuit 60 is comprised of a dummy column 61 coupled between nodes N1 and N2, the dummy column 61 containing replica transistors and replica memory cells of some of those in the memory array 71 such that the same PVT variation affecting the memory array 71 similarly affects the dummy column 61. The tracking circuit 60 also includes constriction circuit 62 coupled between node N1 and VDD, and constriction circuit 63 coupled between node N2 and GND.

The constriction circuit 62 is comprised of diode coupled p-channel transistors T1-T4 connected in series between node N1 and VDD, while the constriction circuit 63 is comprised of diode coupled n-channel transistors M1-M4 connected in series between node N2 and GND. A control signal Ctrl1 is produced at node N1, and a control signal Ctrl2 is produced at node N2.

Virtual supply voltage Vvdd generation circuit 70'' is comprised of a first branch 72a'', second branch 72b'', and third branch 72c'' that are coupled between VDD and node N3 and collectively serve to generate the virtual supply voltage Vvdd at node N3, and an enable transistor ET1 that selectively bypasses the first, second, and third branches 72a'', 72b'', and 72c'' to directly tie Vvdd to VDD.

In particular, the first branch 72a'' is comprised of a diode coupled p-channel transistor T5 connected to node N3, and a p-channel transistor T6 having its drain connected to the source of p-channel transistor T5, its source connected the drain of p-channel transistor T9, and its gate connected to node N1 to be biased by the control signal Ctrl1. The p-channel transistor T9 has its source connected to VDD, and its gate biased by the LVB signal (which is the complement of a LV signal).

The second branch 72b'' is comprised of series connected diode coupled p-channel transistors T7 and T8, with diode coupled p-channel transistor T7 connected to node N3. The second branch 72b'' also includes p-channel transistor T10 having its drain connected to the source of p-channel transistor T8, its source connected to VDD, and its gate biased by the LVB signal.

The third branch 72c'' is comprised of series connected diode coupled p-channel transistors T11-T13, with diode coupled p-channel transistor T11 connected to node N3. The third branch 72c'' also includes p-channel transistor T14 having its drain connected to the source of p-channel transistor T13, its source connected to VDD, and its gate biased by the LV signal.

Virtual ground voltage generation circuit 75'' is comprised of a first branch 73a'', second branch 73b'', and third branch 73c'' that are coupled between GND and node N4 and collectively serve to generate the virtual ground voltage Vgnd at node N4, and an enable transistor ET2 that selectively bypasses the first, second, and third branches 73a'', 73b'', and 73c'' to directly tie Vgnd to GND.

In particular, the first branch 73a'' is comprised of a diode coupled n-channel transistor M5 connected to node N4, and a n-channel transistor M6 having its drain connected to the source of n-channel transistor M5, its source connected the drain of n-channel transistor M9, and its gate connected to node N2 to be biased by the control signal Ctrl2. The n-channel transistor M9 has its source connected to GND, and its gate biased by the LV signal.

The second branch 73b'' is comprised of series connected diode coupled n-channel transistors M7 and M8, with diode coupled n-channel transistor M7 connected to node N4. The second branch 73b'' also includes n-channel transistor M10 having its drain connected to the source of n-channel transistor M8, its source connected to GND, and its gate biased by the LV signal.

The third branch 73c'' is comprised of series connected diode coupled n-channel transistors M11-M13, with diode coupled n-channel transistor M11 connected to node N4. The third branch 73c'' also includes n-channel transistor M14 having its drain connected to the source of n-channel transistor M13, its source connected to GND, and its gate biased by the LVB signal.

In operation of the memory device 50a", the difference between virtual supply Vvdd and virtual ground Vgnd may fall at different process corners, and as explained, if this difference were to fall sufficiently, the worse off of transistors within the memory array 71 for that corner could switch, causing the memory cell into which they are incorporated to lose data. Therefore, the number of diode coupled transistors in the constriction circuits 62 and 63 is set so that the control signal Ctrl1 falls as Vvdd falls, and falls at a rate sufficient to turn on p-channel transistor T6 before the difference between Vvdd and Vgnd decreases enough to result in potential data loss due to low RNM, and so that the control signal Ctrl2 rises as Vgnd rises, and rises at a rate sufficient to turn on n-channel transistor M6 before the difference between Vvdd and Vgnd decreases enough to result in potential data loss. The turning on of p-channel transistor T6 connects the first branch 72a" in parallel with the second branch 72b", with the result being that the voltage drop between VDD and Vvdd falls and therefore Vvdd rises, provided that the LVB signal is low turning on p-channel transistor T9; likewise, the turning on of n-channel transistor M6 connects the first branch 73a" in parallel with the second branch 73b", with the result being that the voltage drop between GND and Vgnd falls and therefore Vgnd falls, provided that the LV channel is high turning on n-channel transistor M9; collectively this increases the difference between Vvdd and Vgnd to thereby raise RNM to a safe level, and since as explained p-channel transistor T6 and n-channel transistor M6 are turned on prior to RNM lowering enough to result in potential data loss, data loss is prevented.

Note here that the third branch 72c" is enabled when LV is low, allowing for further control over Vvdd. When LV is low and LVB is therefore high, the first and second branches 72a", 72b" are disabled, while the third branch 72c" is enabled. Also when LV is low, the first and second branches 73a" and 73b" are disabled, while the third branch 73c" is enabled. Therefore, when LV is low, the Vvdd voltage is fixed at three diode thresholds below VDD, and the Vgnd voltage is fixed at three diode thresholds above GND. When LV is high and LVB is therefore low, the first and second branches 72a", 72b" are enabled, while the third branch 72c" is disabled. Also when LV is high, the first and second branches 73a", 73b" are enabled, while the third branch 73c" is disabled. Therefore, when LV is high, the Vvdd voltage is fixed at two diode thresholds below VDD, but transistor T6 can be enabled by Ctrl1 to reduce Vvdd to one diode threshold below VDD. Likewise, when LV is high, the Vgnd voltage is fixed at two diode thresholds above GND, but transistor M6 can be enabled by Ctrl2 to reduce Vgnd to one diode threshold above Gnd.

Figure 6B:
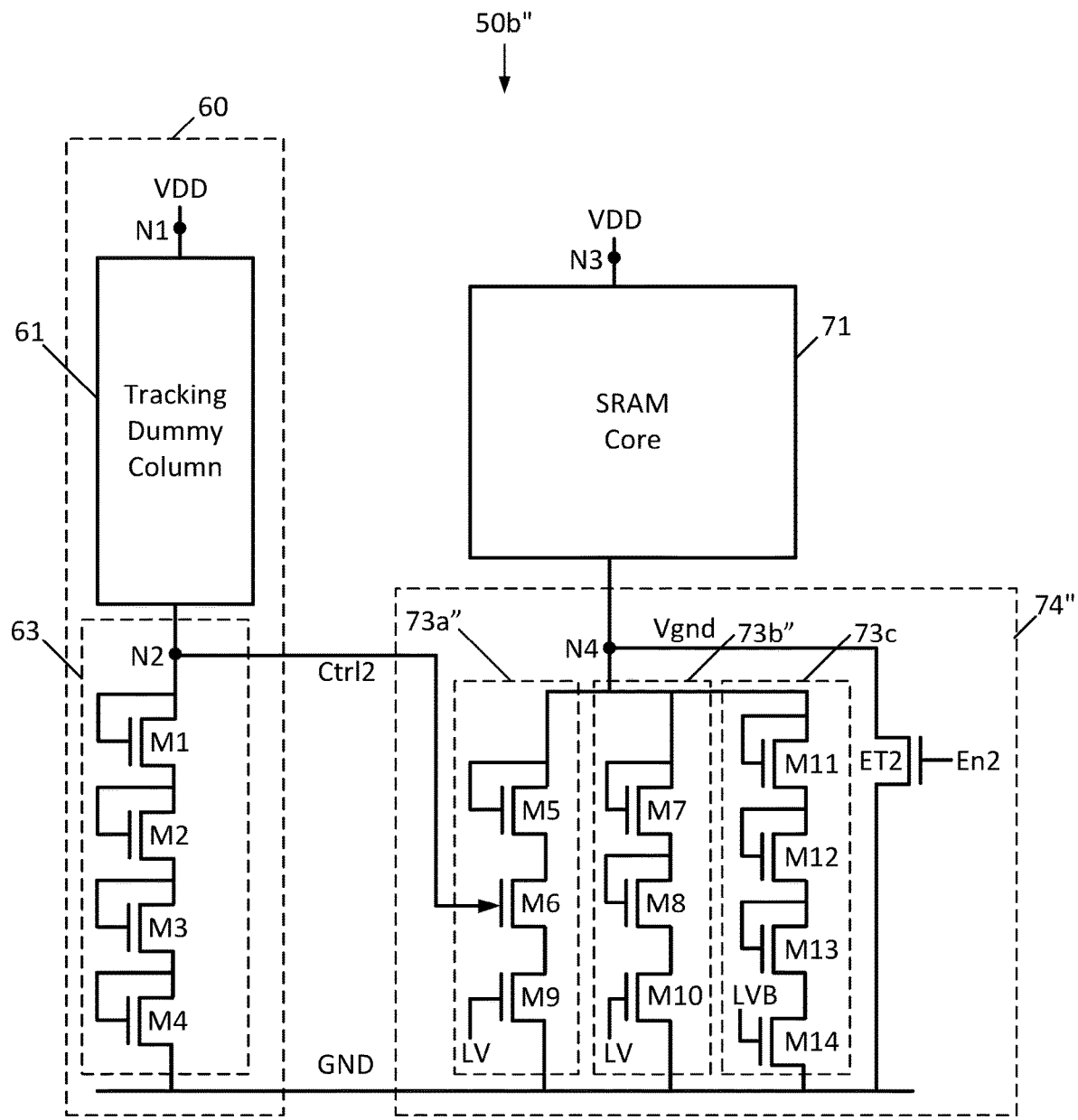
FIG. 6B is variant of the embodiment of FIG. 6A.

It should be understood that the constriction circuit 62 and virtual supply voltage generation circuit 70 need not be present, that node N1 (and thus the tracking dummy column 61) could be directly coupled to VDD, and that node N3 (and thus the SRAM core 71) could be directly coupled to VDD. This is shown in FIG. 6B.

In operation of the memory device 50b", the difference between supply voltage VDD and virtual ground Vgnd may fall at different process corners, and as explained, if this difference were to fall sufficiently, the worse off of transistors within the memory array 71 for that corner could switch, causing the memory cell into which they are incorporated to lose data. Therefore, the number of diode coupled transistors in the constriction circuit 63 is set so that the control signal Ctrl2 rises as Vgnd rises, and rises at a rate sufficient to turn on n-channel transistor M6 before the difference between VDD and Vgnd decreases enough to result in potential data loss. The turning on of n-channel transistor M6 connects the first branch 73a" in parallel with the second branch 73b", with the result being that the voltage drop between GND and Vgnd falls and therefore Vgnd falls, provided that the LV voltage is high turning on n-channel transistor M9; collectively this increases the difference between VDD and Vgnd to thereby raise RNM to a safe level, and since as explained n-channel transistor M6 is turned on prior to RNM lowering enough to result in potential data loss, data loss is prevented.

Note that here the third branch 73c" is enabled when LV is low, allowing for further control over Vgnd. When LV is low, LVB is high, and first and second branches 73a" and 73b" are disabled while the third branch 73c" is enabled, allowing for Vgnd to be set using only the transistors of the third branch 73c". Likewise, when LV is high, LVB is low, so the first and second branches 73a" and 73b" are enabled while the third branch 73c" is disabled, allowing for Vgnd to be set using only the transistors of the first and second branches 73a" and 73b". In greater detail, when LV is low, Vgnd is fixed at three diode thresholds above GND; when LV is high, Vgnd is fixed at two diode thresholds above GND, but n-channel transistor M6 can be enabled by Ctrl2 to reduce Vgnd to one diode threshold above GND.

Note that although constriction circuits 62 above are shown as a stack of p-channel transistors and constriction circuits 63 are shown as a stack of n-channel transistors, each of these constriction circuits may instead be a combination of p and n channel transistors.

In addition, it should be noted that an advantage provided by the memory devices 50a-50b, 50a'-50b', and 50a"-50b" is when there is a mismatch in process centering between the SRAM 71 and logic devices (which end up slower than the SRAM). The increased RNM provided by the tracking from control signal Ctrl2 lowers virtual ground, helping to restore stability in this mismatch situation.

Figure 7A:
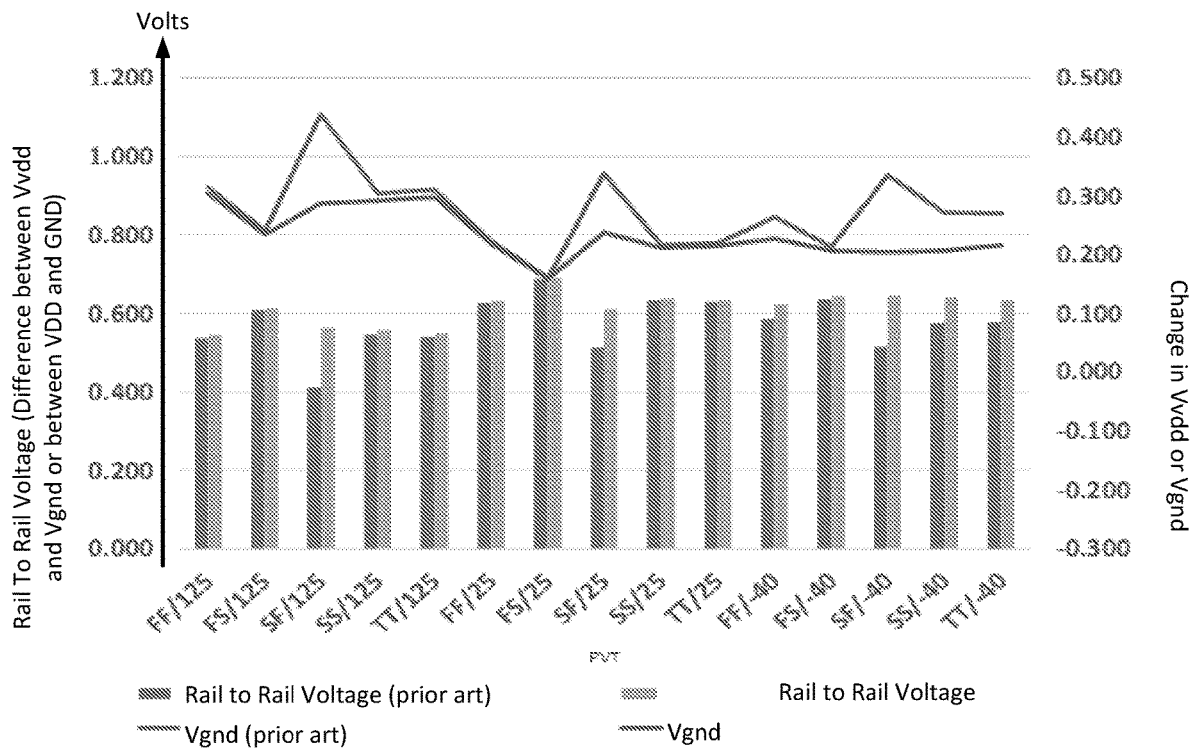
FIG. 7A is a graph showing rail to rail voltages and virtual ground voltages for the devices of this disclosure at different temperatures and for different process corners.
Figure 7B:
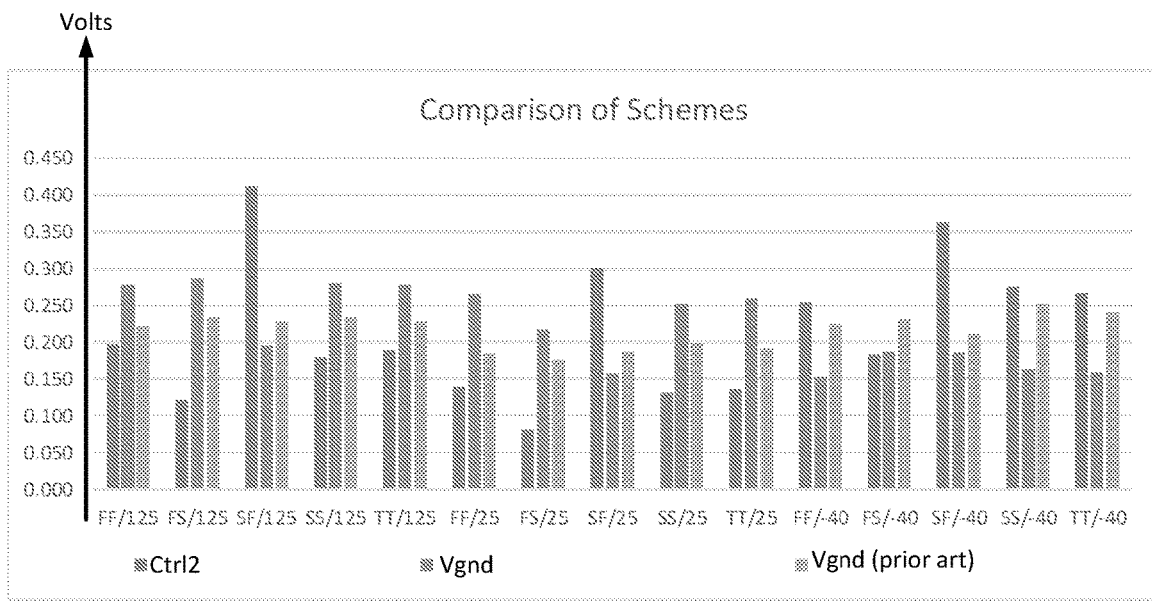
FIG. 7B is a graph showing control voltages and virtual ground voltages for the devices of this disclosure at different temperatures and for different process corners.

The robust performance provided by the memory devices 50a-50b, 50a'-50b', and 50a"-50b" can be seen in the graph of FIGS. 7A-7B. Here, the rail to rail voltage (difference between Vvdd and Vgnd or VDD and GND) and the Vgnd produced by the virtual ground generation circuit 75 can be seen for different operating temperatures at different process corners.

Stability of cells of the memory array 30 in standby is at its lowest in the slow-fast process corner. Therefore, in FIG. 7A, notice that for the slow-fast operating corner at an operating temperature of 125° C., the prior art designs would have a rail to rail voltage of shortly over 0.4V, while the for the memory devices 50a-50b, 50a'-50b', and 50a"-50b" the rail to rail voltage ends up at nearly 0.6V. Likewise, for this slow-fast operating corner at 125° C., the Vgnd produced by the prior art designs would be 1.1V, while for the memory devices 50a-50b, 50a'-50b', and 50a"-50b" the Vgnd produced would be 0.9V. Similarly, in FIG. 7B, notice that for the slow-fast operating corner at an operating temperature of 125° C., the prior art designs would have Vgnd of approximately 0.225V, yet for the memory devices 50a-50b, 50a'-50b', and 50a"-50b", the second control voltage Ctrl2 increases to over 0.4V to cause Vgnd to fall to below 0.2V, enhancing RNM.

Since leakage currents at cold temperatures are low, there is little downside to reducing Vgnd, and therefore, for example, at the slow-fast operating corner at an operating temperature of −40° C., the rail to rail voltage in FIG. 7A rises to over 0.6V as opposed to a little over 0.5V for the prior art. Also, notice that here the prior art designs would have a Vgnd of a little over 0.2V, but as can be seen in FIG. 7B, Vgnd for the designs of the memory devices 50a-50b, 50a'-50a', and 50a"-50a" falls to under 0.2V.

From FIG. 7B it can be noted that for process corners where low RNM is less of a concern, Vgnd for the designs of the memory devices 50a-50b, 50a'-50a', and 50a"-50a" is actually raised over the prior art to reduce leakage current and thus power consumption.

Shown in FIG. 7C is a chart showing a comparison between the control signal Ctrl2, the virtual ground Vgnd, and Vgnd from prior art designs, for different temperatures and at different process corners. As an example, for an operating temperature of −40° C., at the slow-fast process corner, the virtual ground of a prior art design would be around 0.21V, while for the designs described herein the virtual ground is instead about 0.19V.

Figure 8:
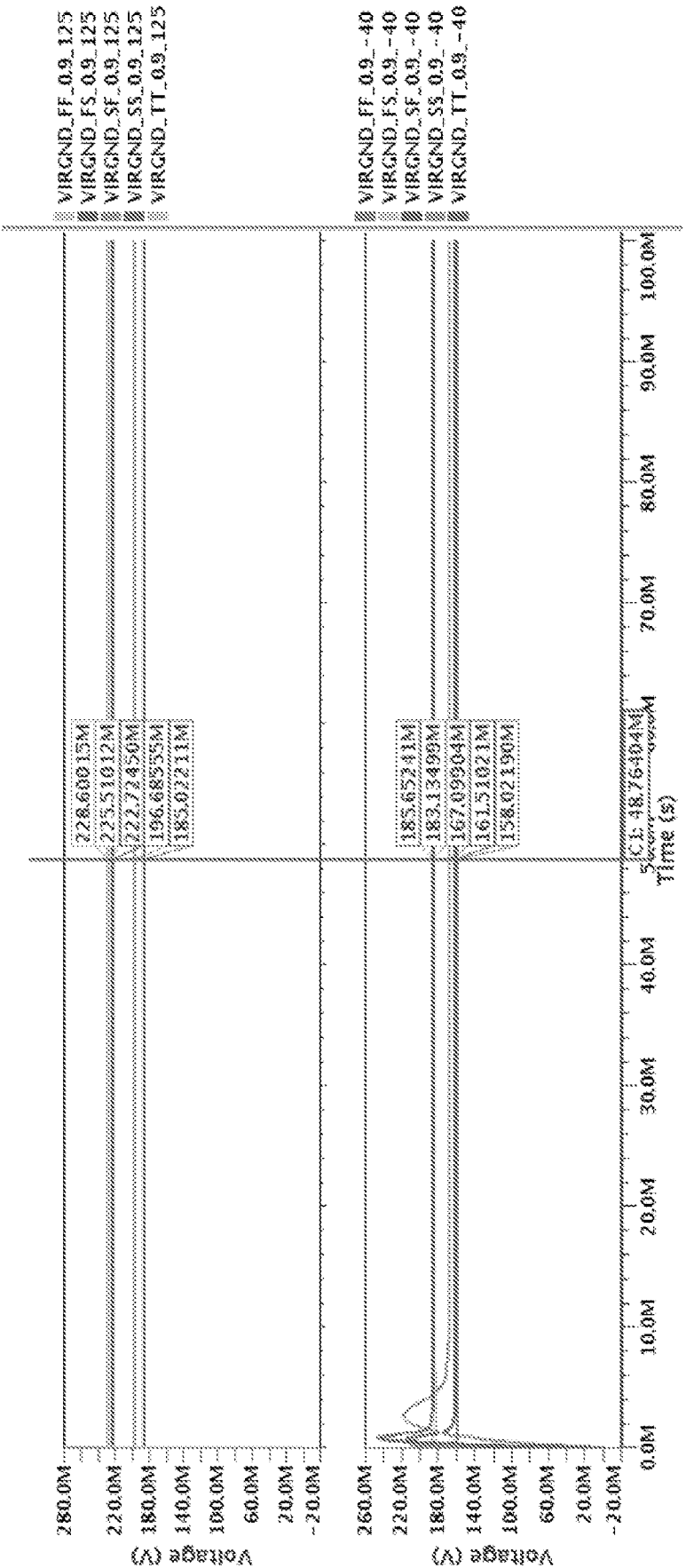
FIG. 8 is a graph showing virtual ground voltages for the devices of this disclosure at different temperatures and for different process corners.

Another graph showing the virtual ground voltage Vgnd produced by the memory devices 50a-50b, 50a'-50b', and 50a"-50b" over time for different process corners is contained in FIG. 8. Here, note that the top graph shows Vgnd for different process corners at 125° C. while the bottom graph shows Vgnd for different process corners at −40° C. Referring first to the top graph, it can be seen that: for the slow-fast corner, Vgnd settles at about 196.68 mV; for the fast-slow corner, Vgnd settles at about 185.02 mV; for the fast-fast corner, Vgnd settles at about 228.60 mV; for the slow-slow corner, Vgnd settles at about 222.72 mV; and for the typical-typical corner, Vgnd settles at about 185.02 mV. For the bottom graph, it can be seen that: for the slow-fast corner, Vgnd settles at about 185.65 mV; for the fast-slow corner, Vgnd settles at about 183.13V; for the fast-fast corner, Vgnd settles at about 158.02 mV; and for the typical-typical corner, Vgnd settles at about 161.51 mV.

Figure 9:
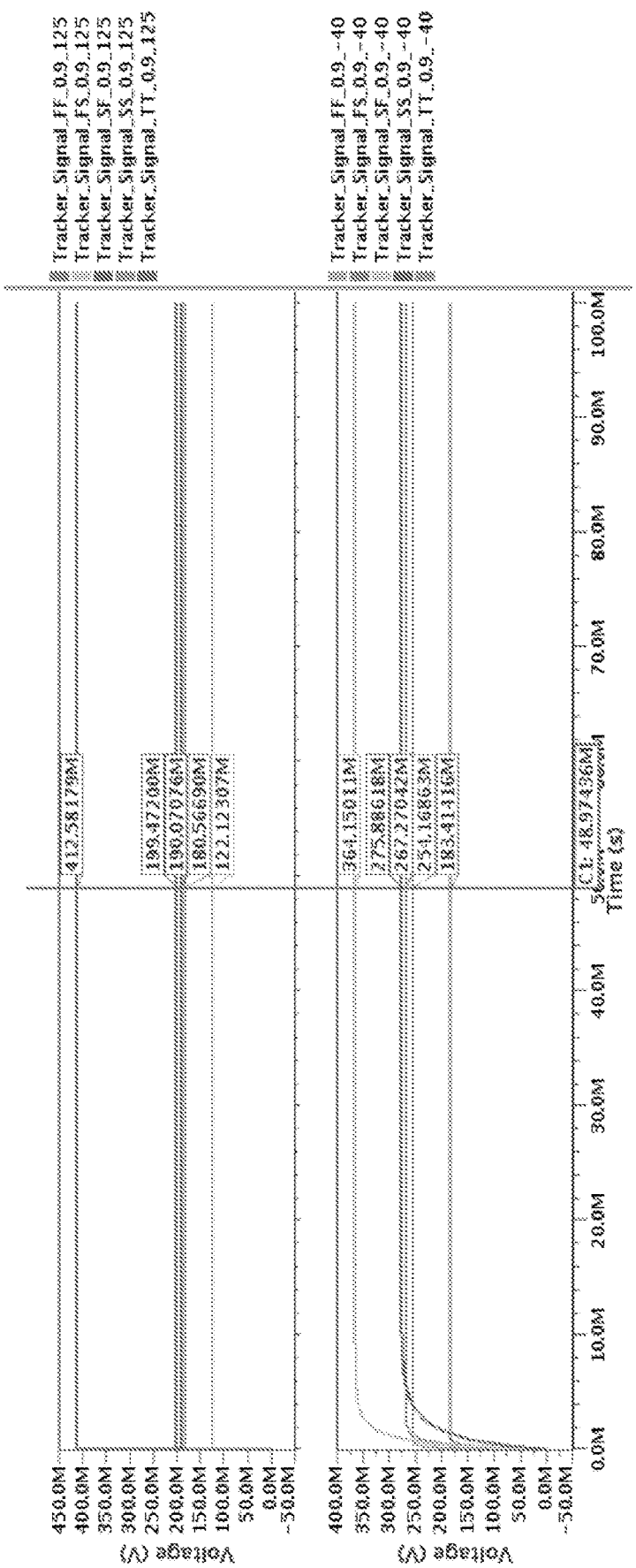
FIG. 9 is a graph showing control signal voltages for the devices of this disclosure at different temperatures and for different process corners.

Another graph showing the control signal Ctrl2 produced by the memory devices 50a-50b, 50a'-50b', and 50a"-50b" over time for different process corners is contained in FIG. 9. Here, note that the top graph shows Ctrl2 for different process corners at 125° C. while the bottom graph shows Ctrl2 for different process corners at −40° C. Referring first to the top graph, it can be seen that: for the slow-fast corner, Ctrl2 settles at about 412.58 mV; for the fast-slow corner, Ctrl2 settles at about 180.57 mV; for the fast-fast corner, Ctrl2 settles at about 199.47 mV; for the slow-slow corner, Ctrl2 settles at about 180.57 mV; and for the typical-typical corner, Ctrl2 settles at about 190.07 mV. For the bottom graph, it can be seen that: for the slow-fast corner, Ctrl2 settles at about 364.15 mV; for the fast-slow corner, Ctrl2 settles at about 183.41 mV; for the fast-fast corner, Ctrl2 settles at about 254.17 mV; and for the typical-typical corner, Ctrl2 settles at about 267.27 mV.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A memory device, comprising:
a memory array powered between a supply voltage node and a virtual ground voltage node;
a dummy memory array powered between first and second nodes, the dummy memory array comprised of transistors that are replicas of transistors of the memory array;
a virtual ground generation circuit configured to generate a virtual ground voltage at the virtual ground voltage node as a function of a control voltage; and
a control voltage generation circuit coupled between the second node and ground and configured to generate the control voltage as tracking retention noise margin (RNM) of the memory array, the control voltage rising as the RNM decreases;
wherein the virtual ground generation circuit comprises:
a first branch comprised of at least one diode coupled n-channel transistor coupled between the virtual ground voltage node and ground, the virtual ground voltage being generated at a drain of the at least one diode coupled n-channel transistor; and
a second branch comprised of an n-channel transistor that enables or disables the second branch in response to the control voltage, the second branch being coupled in parallel with the first branch.

2. The memory device of claim 1, wherein the control voltage generation circuit comprises a plurality of diode coupled n-channel transistors coupled between the second node and ground, the control voltage being generated at a drain of one of the plurality of diode coupled n-channel transistors.

3. The memory device of claim 1, wherein the second branch further comprises at least one diode coupled n-channel transistor connected to the n-channel transistor that enables or disables the second branch.

4. The memory device of claim 1, wherein the virtual ground generation circuit further comprises:
an enable n-channel transistor that selectively couples the virtual ground voltage node to ground in response to an enable signal.

5. The memory device of claim 1, further comprising a virtual supply generation circuit configured to generate a virtual supply voltage at the supply voltage node as a function of an additional control voltage; and further comprising an additional control voltage generation circuit coupled between the first node and a power supply voltage and configured to generate the additional control voltage as tracking RNM of the memory array, the additional control voltage falling as RNM decreases.

6. A memory device, comprising:
a memory array powered between a virtual supply voltage node and a virtual ground voltage node;
a dummy memory array powered between first and second nodes, the dummy memory array comprised of at least some transistors that are replicas of transistors of the memory array;
a virtual supply voltage generation circuit configured to generate a virtual supply voltage at the virtual supply voltage node as a function of a control voltage; and
a control voltage generation circuit coupled between the first node and a power supply voltage and configured to generate the control voltage as tracking retention noise margin (RNM) of the memory array, the control voltage falling as the RNM decreases;
wherein the virtual supply voltage generation circuit comprises:
a first branch comprised of at least one diode coupled p-channel transistor coupled between the virtual supply voltage node and the power supply voltage, the virtual supply voltage being generated at a drain of the at least one diode coupled p-channel transistor; and
a second branch comprised of a p-channel transistor that enables or disables the second branch in response to the control voltage, the second branch being coupled in parallel with the first branch.

7. The memory device of claim 6, wherein the control voltage generation circuit comprises a plurality of diode coupled p-channel transistors coupled between the virtual supply voltage node and the power supply voltage, the control voltage being generated at a drain of one of the plurality of diode coupled p-channel transistors.

8. The memory device of claim 6, wherein the second branch further comprises at least one diode coupled p-channel transistor connected to the p-channel transistor that enables or disables the second branch.

9. The memory device of claim 6, wherein the virtual supply voltage generation circuit further comprises:
an enable p-channel transistor that selectively couples the virtual supply voltage node to the power supply voltage in response to an enable signal.

10. A method, comprising:
powering a memory array between a virtual supply voltage and a virtual ground voltage;
monitoring retention noise margin (RNM) of the memory array;
asserting a control signal in response to the RNM decreasing below a threshold RNM value; and
lowering the virtual ground voltage and/or raising the virtual supply voltage in response to assertion of the control signal by turning on a transistor connected with a diode coupled transistor to thereby generate the virtual ground voltage and/or the virtual supply voltage.

11. The method of claim 10, wherein the virtual ground voltage is lowered and the virtual supply voltage is raised in response to assertion of the control signal.

12. The method of claim 10,
further comprising generating the virtual supply voltage from a supply voltage and generating the virtual ground voltage from a ground voltage; and
further comprising determining whether the RNM of the memory array has decreased below the threshold RNM value by:
generating a dummy supply voltage from the supply voltage and generating a dummy ground voltage from the ground voltage;
powering a dummy memory array between the dummy supply voltage and the dummy ground voltage; and
asserting the control signal in response to the dummy ground voltage rising above a threshold dummy ground voltage value and/or in response to the dummy supply voltage falling below a threshold dummy supply voltage.

13. A memory device, comprising:
a memory array powered between a first memory supply node and a second memory supply node;
a tracking circuit configured to track voltage at the first memory supply node and to assert a first control signal in response to a relationship between the voltage at the first memory supply node and a first threshold voltage value indicating that a difference between the voltage at the first memory supply node and the second memory supply node has decreased below a threshold range value; and
a first virtual supply voltage generation circuit configured to generate a first virtual supply voltage to the first memory supply node when the first control signal is asserted but to generate a second virtual supply voltage to the first memory supply node when the first control signal is not asserted;
wherein the first virtual supply voltage generation circuit comprises:
a first transistor branch comprised of at least one diode coupled transistor, the first transistor branch coupled between the first memory supply node and a first supply voltage and generating the second virtual supply voltage; and
a second transistor branch comprised of at least one transistor biased by the first control signal, the second transistor branch coupled between the first memory supply node and the first supply voltage and generating the first virtual supply voltage.

14. The memory device of claim 13,
wherein the tracking circuit is further configured to track voltage at the second memory supply node and to assert a second control signal in response to a relationship between the voltage at the second memory supply node and a second threshold voltage value indicating that a difference between the voltage at the first memory supply node and the second memory supply node has decreased below the threshold range value; and further comprising a second virtual supply voltage generation circuit configured to generate a third virtual supply voltage to the second memory supply node when the second control signal is asserted but to generate a fourth virtual supply voltage to the second memory supply node when the second control signal is not asserted.

15. The memory device of claim 14,
wherein the tracking circuit asserts the first control signal in response to the relationship between the voltage at the first memory supply node and the first threshold voltage value being that the voltage at the first memory supply node has decreased below the first threshold voltage value; and
wherein the tracking circuit asserts the second control signal in response to the relationship between the voltage at the second memory supply node and the second threshold voltage value being that the voltage at the second memory supply node has risen above the second threshold voltage value.

16. The memory device of claim 15, wherein the first virtual supply voltage generation circuit is configured to generate the first and second virtual supply voltages from a power supply voltage, with the second virtual supply voltage being lesser in magnitude than the first virtual supply voltage; and wherein the second virtual supply voltage generation circuit is configured to generate the third and fourth virtual supply voltages from a ground voltage, with the fourth virtual supply voltage being greater in magnitude than the third virtual supply voltage.

17. The memory device of claim 13, wherein the tracking circuit comprises:
a dummy memory array comprised of at least some transistors that are replicas of transistors of the memory array; and
a first constriction circuit coupled between a first dummy supply node for the dummy memory array and a first supply voltage, with the first control signal being generated at the first dummy supply node.

18. The memory device of claim 17, wherein the first constriction circuit comprises a plurality of series connected diode coupled p-channel transistors.

19. The memory device of claim 17, wherein the first virtual supply voltage generation circuit is configured to generate the first and second virtual supply voltages from a supply voltage; and wherein the first supply voltage corresponds to a supply voltage.

20. The memory device of claim 17, wherein the first virtual supply voltage generation circuit is configured to generate the first and second virtual supply voltages from a ground voltage; and wherein the first supply voltage corresponds to a ground voltage.

21. The memory device of claim 14, wherein the tracking circuit comprises:
   a dummy memory array comprised of at least some transistors that are replicas of transistors of the memory array;
   a first constriction circuit coupled between a first dummy supply node for the dummy memory array and a first supply voltage, with the first control signal being generated at the first dummy supply node; and
   a second constriction circuit coupled between a second dummy supply node for the dummy memory array and a second supply voltage, with the second control signal being generated at the second dummy supply node.

22. The memory device of claim 21, wherein the first constriction circuit comprises a first plurality of series connected diode coupled transistors; and wherein the second constriction circuit comprises a second plurality of series connected diode coupled transistors.

23. The memory device of claim 13, wherein the first virtual supply voltage generation circuit is configured to generate the first and second virtual supply voltages from a supply voltage.

24. The memory device of claim 13, wherein the first virtual supply voltage generation circuit is configured to generate the first and second virtual supply voltages from a ground voltage.

25. The memory device of claim 13, wherein the first virtual supply voltage generation circuit further comprises:
   an enable transistor branch comprised of at least one enable transistor biased by an enable signal, the enable transistor branch coupled between the first memory supply node and the first supply voltage and clamping the first memory supply node to the first supply voltage in response to the enable signal.

26. The memory device of claim 13, wherein the memory array and tracking circuit are contained within a same integrated circuit.

27. A method, comprising:
   powering a memory array between a supply voltage and a virtual ground voltage;
   asserting a control signal in response to a difference between the supply voltage and virtual ground voltage decreasing below a threshold difference value; and
   lowering the virtual ground voltage in response to assertion of the control signal by turning on a transistor connected with a diode coupled transistor to thereby generate the virtual ground voltage and/or the virtual supply voltage.

28. The method of claim 27,
further comprising generating the virtual ground voltage from a ground voltage; and
further comprising determining whether the difference between the supply voltage and virtual ground voltage has fallen below the threshold difference value by:
   generating a dummy supply voltage from the supply voltage and generating a dummy ground voltage from the ground voltage;
   powering a dummy memory array between the dummy supply voltage and the dummy ground voltage; and
   asserting the control signal in response to the dummy ground voltage rising above a threshold dummy ground voltage value.

\* \* \* \* \*